United States Patent
Kim et al.

(10) Patent No.: US 12,356,615 B2
(45) Date of Patent: Jul. 8, 2025

(54) SEMICONDUCTOR DEVICE INCLUDING VERTICAL CHANNEL PATTERN SURROUNDED BY PROTECTION PATTERN

(71) Applicant: Samsung Electronics Co., Ltd., Suwon-si (KR)

(72) Inventors: Choasub Kim, Hwaseong-si (KR); Dongmin Kyeon, Seongnam-si (KR); Shinyoung Kim, Yongin-si (KR); Hayan Park, Hwaseong-si (KR); Youngsun Cho, Seongnam-si (KR); Changhyun Hur, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 636 days.

(21) Appl. No.: 17/693,875

(22) Filed: Mar. 14, 2022

(65) Prior Publication Data
US 2022/0399359 A1    Dec. 15, 2022

(30) Foreign Application Priority Data
Jun. 11, 2021 (KR) .................... 10-2021-0076237

(51) Int. Cl.
*H10B 43/10* (2023.01)
*H10B 41/10* (2023.01)
*H10B 41/27* (2023.01)
*H10B 43/27* (2023.01)

(52) U.S. Cl.
CPC ............. *H10B 43/10* (2023.02); *H10B 41/10* (2023.02); *H10B 41/27* (2023.02); *H10B 43/27* (2023.02)

(58) Field of Classification Search
CPC ........ H10B 43/10; H10B 41/10; H10B 41/27; H10B 43/27
USPC .......................................................... 257/314
See application file for complete search history.

(56) References Cited

U.S. PATENT DOCUMENTS

| | | |
|---|---|---|
| 9,153,577 B2 | 10/2015 | Park |
| 9,997,537 B2 | 6/2018 | Lee et al. |
| 10,074,666 B2 | 9/2018 | Ge et al. |
| 10,290,647 B2 | 5/2019 | Noguchi et al. |
| 10,756,185 B2 | 8/2020 | Choi et al. |
| 2021/0091204 A1* | 3/2021 | Rabkin ............. H01L 29/41725 |

* cited by examiner

*Primary Examiner* — Quoc D Hoang
(74) *Attorney, Agent, or Firm* — MORGAN, LEWIS & BOCKIUS LLP

(57) ABSTRACT

A semiconductor device includes a memory cell region positioned on a substrate and comprising a real memory cell region and a dummy memory cell region; and a connection region extending in a first direction parallel to a surface of the substrate in the memory cell region. The dummy memory cell region includes a plurality of dummy vertical channel structures spaced apart from each other. Each of the plurality of dummy vertical channel structures includes a vertical channel pattern in contact with the substrate while penetrating a stack structure comprising a plurality of insulating layers and a plurality of gate electrodes repeatedly stacked in a third direction perpendicular to a surface of the substrate. A protection pattern is disposed to surround the vertical channel pattern of at least one of the plurality of dummy vertical channel structures.

20 Claims, 26 Drawing Sheets

SEMICONDUCTOR DEVICE INCLUDING VERTICAL CHANNEL PATTERN SURROUNDED BY PROTECTION PATTERN

CROSS-REFERENCE TO RELATED APPLICATION

This application is based on and claims priority under 35 U.S.C. § 119 to Korean Patent Application No. 10-2021-0076237, filed on Jun. 11, 2021, in the Korean Intellectual Property Office, the disclosure of which is incorporated by reference herein in its entirety.

BACKGROUND

Inventive concepts relate to a semiconductor device, and more particularly, to a semiconductor device including a vertical memory cell.

In an electronic system requiring data storage, a semiconductor device capable of storing high-capacity data is required or desired. Accordingly, research into a method of increasing the data storage capacity of a semiconductor device has been conducted. For example, as one of the methods of increasing the data storage capacity of the semiconductor device, a semiconductor device including three-dimensionally arranged vertical memory cells instead of two-dimensionally arranged memory cells has been proposed.

SUMMARY

Inventive concepts provide a semiconductor device capable of improving the reliability of three-dimensionally arranged vertical memory cells.

According to some example embodiments, there is provided a semiconductor device including a memory cell region on a substrate and including a real memory cell region and a dummy memory cell region. The semiconductor device includes a connection region extending with the memory cell region in a first direction that is parallel to a surface of the substrate.

The dummy memory cell region may include a plurality of dummy vertical channel structures spaced apart from each other. Each of the plurality of dummy vertical channel structures may include a vertical channel pattern contacting the substrate and penetrating a stack structure including a plurality of insulating layers and a plurality of gate electrodes repeatedly stacked in a third direction perpendicular to a surface of the substrate. A protection pattern may be disposed to surround the vertical channel pattern of at least one of the plurality of dummy vertical channel structures.

According to some example embodiments, there is provided a semiconductor device including a memory cell region on a substrate and including a real memory cell region and a dummy memory cell region, and a connection region extending with the memory cell region in a first direction parallel to a surface of the substrate.

The dummy memory cell region may include first and second dummy vertical channel structures spaced apart from each other. First and second dummy vertical channel structures respectively may include first and second vertical channel patterns contacting the substrate and penetrating a stack structure including a plurality of insulating layers and a plurality of gate electrodes repeatedly stacked in a third direction perpendicular to a surface of the substrate.

A protection pattern may surround the first vertical channel pattern. A gate oxide layer may surround the second vertical channel pattern.

According to another aspect of inventive concepts, there is provided a semiconductor device including a memory cell region positioned on a substrate and including a real memory cell region and a dummy memory cell region, and a connection region extending with the memory cell region in a first direction parallel to a surface of the substrate.

The dummy memory cell region may include first and second dummy vertical channel structures spaced apart from each other. First and second dummy vertical channel structures respectively may include first and second vertical channel patterns in a first recess region and a second recess region recessed from a surface of the substrate to an upper surface of the substrate and penetrating a stack structure including a plurality of insulating layers and a plurality of gate electrodes repeatedly stacked in a third direction that is perpendicular to the surface of the substrate. A protection pattern may surround the first vertical channel pattern. A gate oxide layer that invades both side surfaces of the second vertical channel pattern may be included in the dummy memory cell region.

BRIEF DESCRIPTION OF THE DRAWINGS

Embodiments of inventive concepts will be more clearly understood from the following detailed description taken in conjunction with the accompanying drawings in which.

DETAILED DESCRIPTION OF EXAMPLE EMBODIMENTS

Hereinafter, embodiments will be described in detail with reference to the accompanying drawings. The following embodiments may be implemented as only one, and moreover, the following embodiments may be implemented by a combination of one or more. Therefore, it is not construed that inventive concepts are limited to one embodiment. Herein, the drawings are exaggerated and illustrated for clearly describing various example embodiments.

Figure 1:
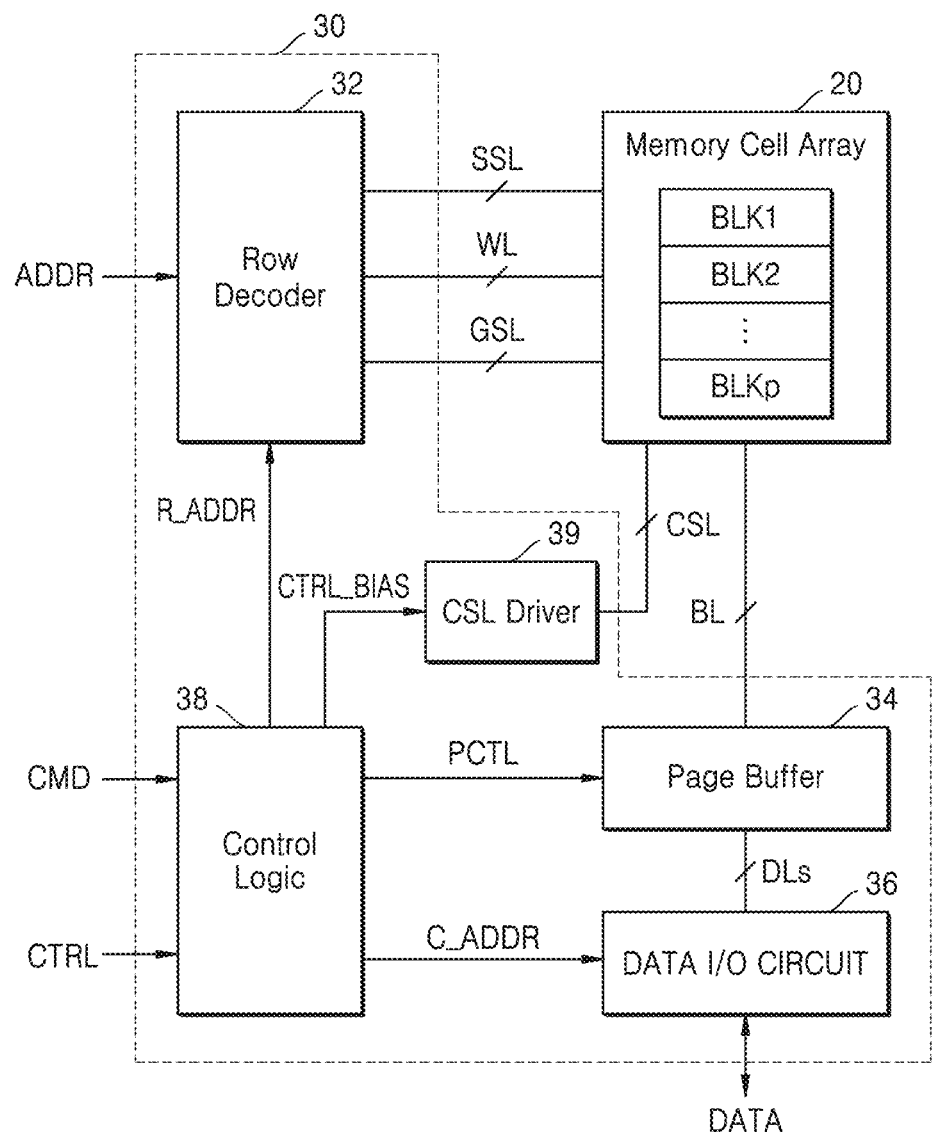
FIG. 1 is a block diagram of a semiconductor device according to an embodiment of inventive concepts.

FIG. 1 is a block diagram of a semiconductor device 10 according to some example embodiments of inventive concepts.

Specifically, the semiconductor device 10 may include a memory cell array 20 and a peripheral circuit 30. The memory cell array 20 includes a plurality of memory cell blocks BLK1, BLK2, . . . , BLKp. Each of the plurality of memory cell blocks BLK1, BLK2, . . . , BLKp may include a plurality of memory cells. The plurality of memory cell blocks BLK1, BLK2, . . . , BLKp may be connected to the peripheral circuit 30 through a bit line BL (e.g. a column line), a word line WL (e.g. a row line), a string selection line SSL, and a ground selection line GSL.

The peripheral circuit 30 may include a row decoder 32, a page buffer 34, a data input/output circuit 36, a control logic 38, and a common source line driver 39. The peripheral circuit 30 may further include various example circuits such as a voltage generation circuit generating various voltages necessary for or used during an operation of the semiconductor device 10, an error correction circuit correcting errors in data read from and/or written to the memory cell array 20, an input/output interface, etc.

The memory cell array 20 may be connected to the row decoder 32 through the word line WL, the string selection line SSL, and the ground selection line GSL, and may be connected to the page buffer 34 through the bit line BL. In the memory cell array 20, the plurality of memory cells included in each of the plurality of memory cell blocks BLK1, BLK2, . . . , BLKp may be flash memory cells.

The memory cell array 20 may include a three-dimensional (3D) memory cell array. The 3D memory cell array may include a plurality of NAND strings, each of which may include a plurality of memory cells respectively connected to a plurality of vertically stacked word lines WL.

The peripheral circuit 30 may receive an address ADDR, a command CMD, and a control signal CTRL from the outside of the semiconductor device 10 (e.g. from a host, not illustrated), and may transmit and receive data DATA to and from a device outside the semiconductor device 10 (e.g. from the host).

The row decoder 32 may select at least one of the plurality of memory cell blocks BLK1, BLK2, . . . , BLKp in response to the address ADDR from the outside, and may select the word line WL of the selected memory cell block, the string selection line SSL and the ground selection line GSL. The row decoder 32 may transmit a voltage for performing a memory operation to the word line WL of the selected memory cell block.

The page buffer 34 may be connected to the memory cell array 20 through the bit line BL. The page buffer 34 may operate as a write driver during a program operation to apply a voltage according to the data DATA to be stored in the memory cell array 20 to the bit line BL, and may operate as a sense amplifier during a read operation to sense the data DATA stored in the memory cell array 20. The page buffer 34 may operate according to a control signal PCTL provided from the control logic 38.

The data input/output circuit 36 may be connected to the page buffer 34 through a plurality of data lines DLs. The data input/output circuit 36 may receive the data DATA from a memory controller (not shown) during the program operation, and may provide the program data DATA to the page buffer 34 based on a column address C_ADDR provided from the control logic 38. The data input/output circuit 36 may provide the read data DATA stored in the page buffer 34 to the memory controller based on the column address C_ADDR provided from the control logic 38 during the read operation.

The data input/output circuit 36 may transmit an input address or instructions to the control logic 38 or the row decoder 32. The peripheral circuit 30 may further include an electro static discharge (ESD) circuit and a pull-up/pull-down driver.

The control logic 38 may receive the command CMD and the control signal CTRL from the memory controller. The control logic 38 may provide a row address R_ADDR to the row decoder 32 and provide the column address C_ADDR to the data input/output circuit 36. The control logic 38 may generate various internal control signals used in the semiconductor device 10 in response to the control signal CTRL. For example, the control logic 38 may adjust a voltage level provided to the word line WL and the bit line BL when performing a memory operation such as a program operation or an erase operation.

The common source line driver 39 may be connected to the memory cell array 20 through the common source line CSL. The common source line driver 39 may apply a common source voltage (e.g., a power voltage) and/or a ground voltage to the common source line CSL based on a bias control signal CTRL_BIAS of the control logic 38.

Figure 2:
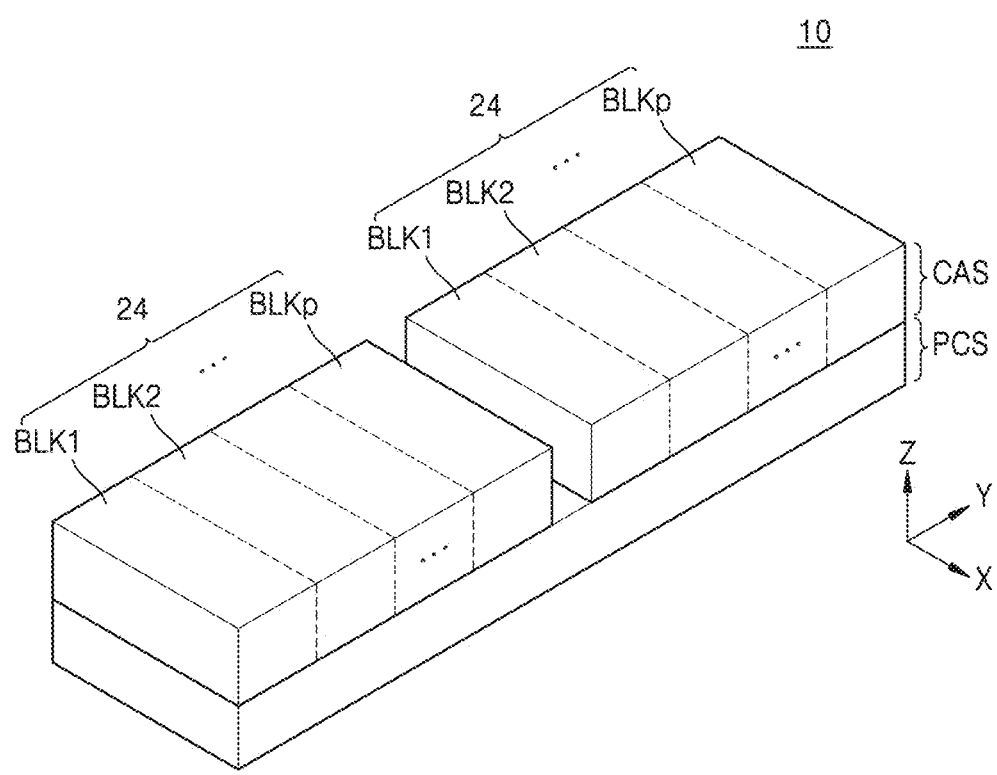
FIG. 2 is a schematic perspective view of a semiconductor device according to an embodiment of inventive concepts.

FIG. 2 is a schematic perspective view of the semiconductor device 10 according to some example embodiments of inventive concepts.

Specifically, the semiconductor device 10 includes a cell array structure CAS and a peripheral circuit structure PCS overlapping each other in a third direction (Z direction). The third direction (Z direction) may be a direction perpendicular to a main surface, for example, a surface of a substrate (not shown in FIG. 2) on which the cell array structure CAS is formed.

A first direction (X direction) and a second direction (Y direction) may be a horizontal direction parallel to the main surface, for example, the surface of the substrate (not shown in FIG. 2) on which the cell array structure CAS is formed. The cell array structure CAS may include the memory cell array 20 illustrated in FIG. 1. The peripheral circuit structure PCS may include the peripheral circuit 30 illustrated in FIG. 1.

The cell array structure CAS may include a plurality of tiles 24. Each of the plurality of tiles 24 may include the plurality of memory cell blocks BLK1, BLK2, . . . , BLKp. Each of the plurality of memory cell blocks BLK1, BLK2, . . . , BLKp may include a plurality of 3D arranged memory cells.

In some example embodiments, two tiles 24 may constitute/correspond to/be included in one mat, but example embodiments are not limited thereto. The memory cell array 20 illustrated in FIG. 1 may include a plurality of mats, for example, four mats, but is not limited thereto.

Figure 3:
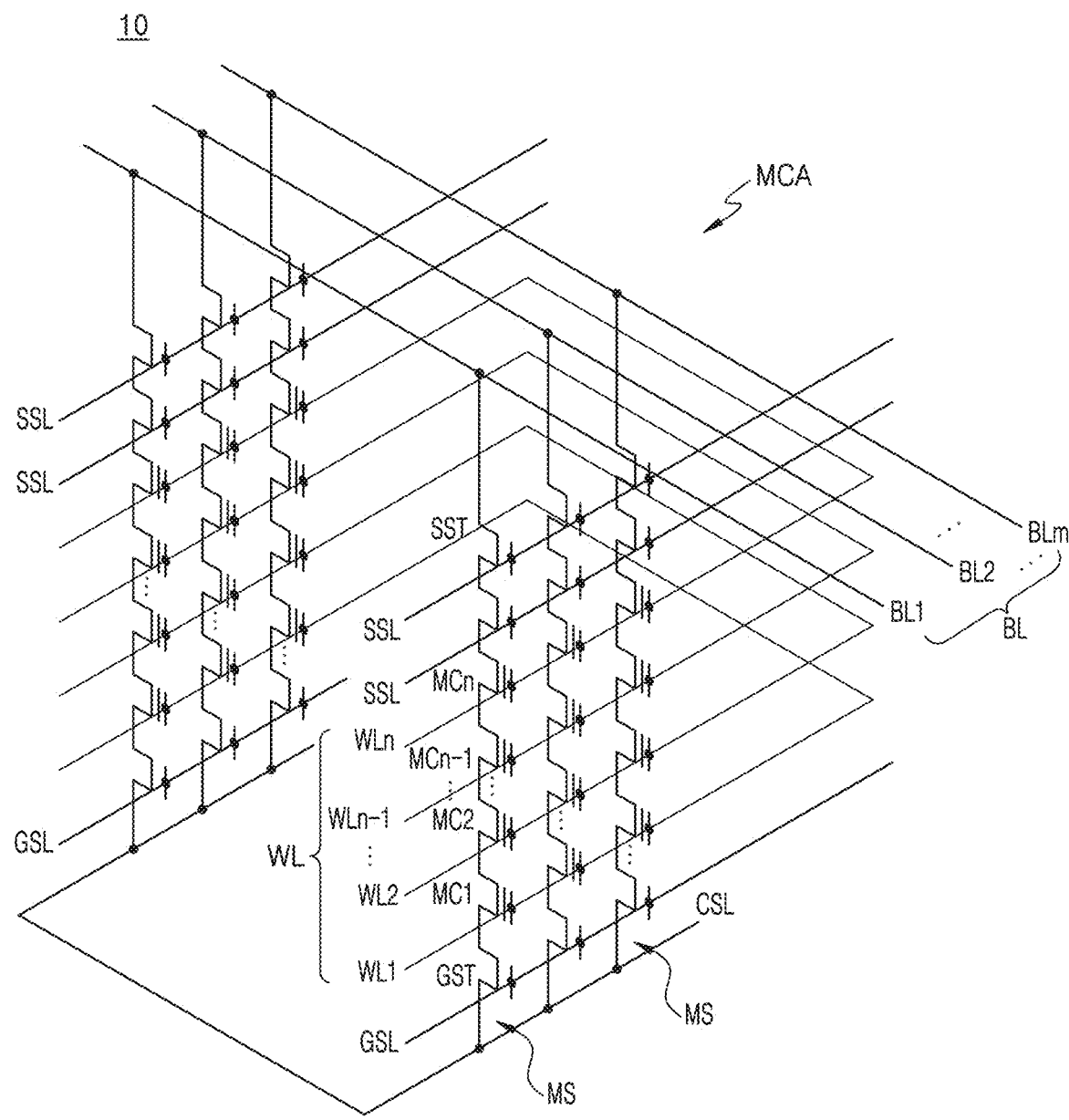
FIG. 3 is an equivalent circuit diagram of a memory cell array of a semiconductor device according to an embodiment of inventive concepts.

FIG. 3 is an equivalent circuit diagram of a memory cell array MCA of the semiconductor device 10 according to some example embodiments of inventive concepts.

In more detail, the semiconductor device 10 may include the memory cell array 20 described with reference to FIG. 1. The memory cell array MCA may include a plurality of memory cells. The memory cell array MCA may include memory cells, such as vertical memory cells.

The vertical memory cell may be a vertical NAND flash memory cell. Each of the plurality of memory cell blocks BLK1, BLK2, ..., BLKp illustrated in FIGS. 1 and 2 may include the memory cell array MCA having a circuit configuration illustrated in FIG. 3.

The memory cell array MCA may include a plurality of memory cell strings MS. The memory cell array MCA may include a plurality of bit lines BL (BL1, BL2, ..., BLm), a plurality of word lines WL (WL1, WL2, ..., WLn−1, WLn), at least one string selection line SSL, at least one ground selection line GSL, and a common source line CSL. The plurality of memory cell strings MS may be formed between the plurality of bit lines BL and the common source line CSL.

In FIG. 3, each of the plurality of memory cell strings MS includes one ground selection line GSL and two string selection lines SSL, but inventive concepts is not limited thereto. For example, each of the plurality of memory cell strings MS may include one ground selection line GSL and one string selection line SSL.

Each of the memory cell strings MS may include a string selection transistor SST, a ground selection transistor GST, and a plurality of memory cell transistors MC1, MC2, ..., MCn−1, MCn. A drain region of the string selection transistor SST may be connected to the bit line BL, and a source region of the ground selection transistor GST may be connected to the common source line CSL. The common source line CSL may be a region to which source regions of the plurality of ground selection transistors GST are commonly connected.

The string selection transistor SST may be connected to the string selection line SSL, and the ground selection transistor GST may be connected to the ground selection line GSL. The plurality of memory cell transistors MC1, MC2, ..., MCn−1, MCn may be respectively connected to the word lines WL.

Figure 4A:
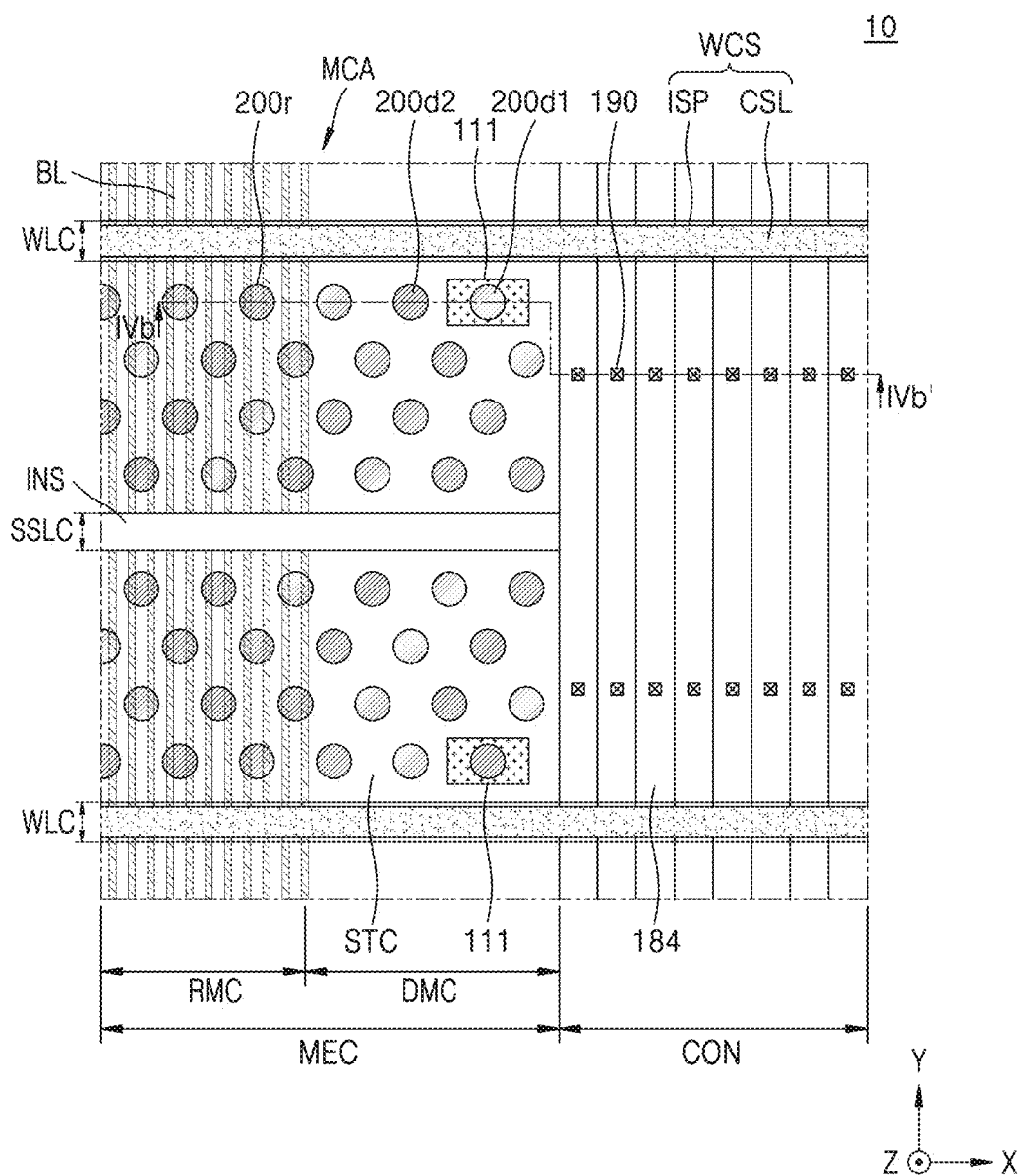
FIG. 4A is a plan view illustrating main components of a semiconductor device according to an embodiment of inventive concepts.
Figure 4B:
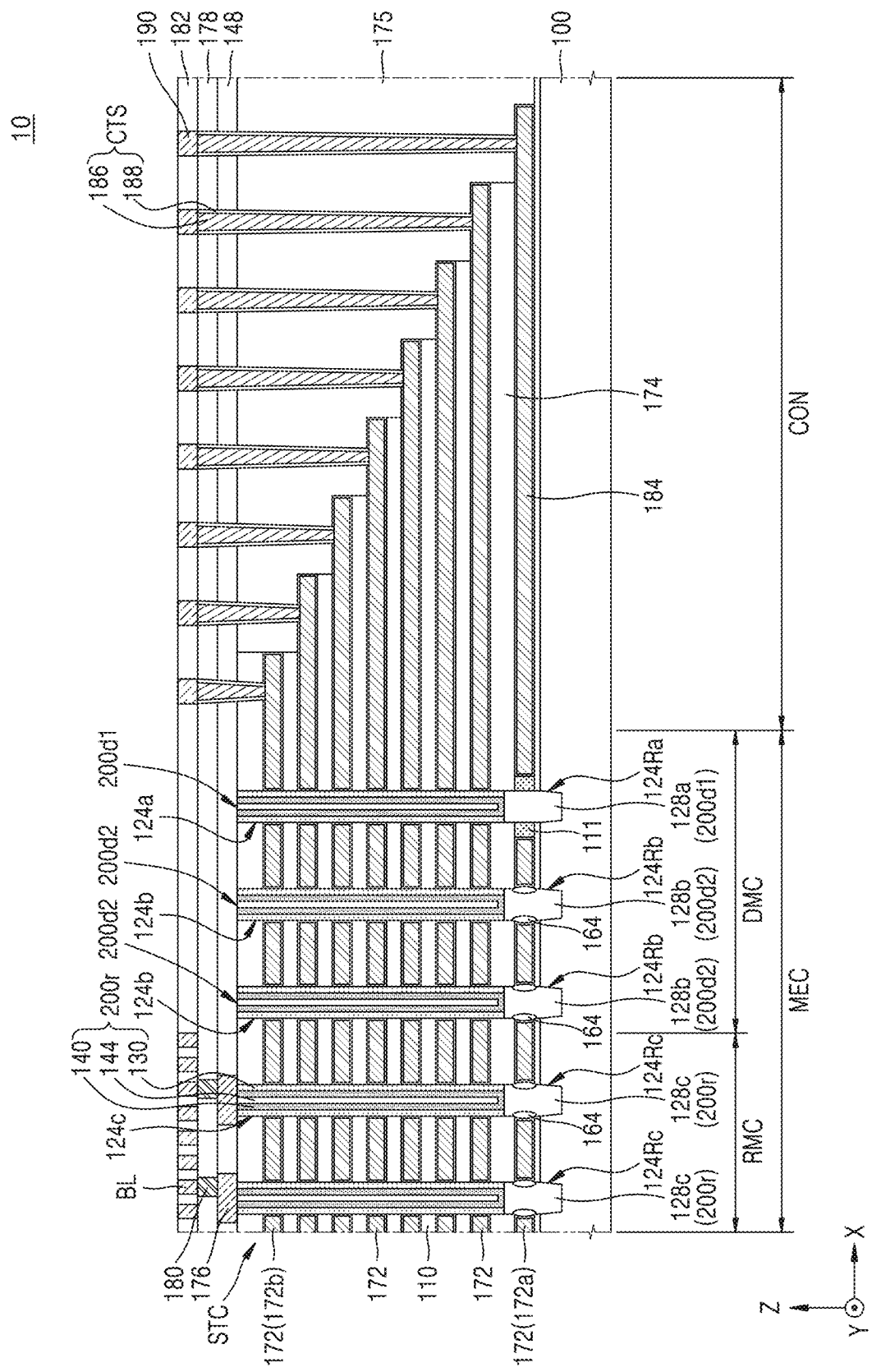
FIG. 4B is a cross-sectional view of a main part taken along line IVb-IVb' of FIG. 4A.

FIG. 4A is a plan view illustrating main components of the semiconductor device 10 according to some example embodiments of inventive concepts, and FIG. 4B is a cross-sectional view of a main part taken along line IVb-IVb' of FIG. 4A.

In more detail, the semiconductor device 10 may include a memory cell region MEC and a connection region CON. In the memory cell region MEC, a memory cell array MCA may be formed. The memory cell region MEC may include a real memory cell region RMC and a dummy memory cell region DMC. Details of the real memory cell region RMC and the dummy memory cell region DMC are described below.

The dummy memory cell region DMC may be disposed between the real memory cell region RMC and the connection region CON in the first direction (X direction). The connection region CON may be an extended region extending from the memory cell region MEC. The connection region CON may be electrically connected to the memory cell region MEC.

The connection region CON may be or have a step shape region/staircase region as shown in FIG. 4B. For example, in the connection region CON, a plurality of conductive regions 184 are formed in a step shape. The conductive regions 184 may be regions in which the gate electrodes 172 extend, as will be described later. An extended insulating layer 174 extending from the insulating layer 110 of the memory cell region MEC may be between the conductive regions 184. The conductive regions 184 may be connected to contact structures CTS.

Each of the contact structures CTS may include a contact plug 186 that extends in the third direction (Z direction), that is, in a direction perpendicular to a surface of a substrate 100, and an insulating plug 188 surrounding the contact plug 186. The contact plug 186 may be electrically connected to the conductive region 184. Contact pads 190 may be positioned on the contact structures CTS.

The contact pads 190 may be electrically connected to the conductive region 184 through the contact structure CTS. Reference numeral 148 of FIG. 4B may denote or correspond to a cap insulating layer, and reference numerals 175, 178, and 182 of FIG. 4B may denote or correspond to interlayer insulating layers.

The connection region CON may be disposed adjacent to an edge part of the memory cell region MEC. Although only the connection region CON disposed on one side of the memory cell region MEC is illustrated in FIG. 4, the connection region CON may be respectively disposed on both sides of the memory cell region MEC in the first direction (X direction).

The semiconductor device 10 may include a plurality of word line cut regions WLC and common source lines CSL. The plurality of word line cut regions WLC may extend in the first direction (X direction). The plurality of common source lines CSL may extend in the first direction (X direction).

The plurality of common source lines CSL may be formed to partially fill the word line cut region WLC. In the plurality of word line cut regions WLC, the common source line CSL may be surrounded by an insulating spacer ISP. The common source lines CSL and the insulating spacer ISP may constitute a word line cut structure WCS.

The semiconductor device 10 may include a string selection line cut region SSLC. Two string selection lines (SSL of FIG. 3) adjacent in the second direction (Y direction) may be spaced apart from each other with the string selection line cut region SSLC therebetween.

The string selection line cut region SSLC may be filled with an insulating layer INS. The insulating layer INS may include an oxide layer, a nitride layer, or a combination thereof. At least a part of the string selection line cut region SSLC may be filled with an air gap. The air gap may include air, such as clean, dry air; however, example embodiments are not limited thereto.

Here, the memory cell region MEC is described in more detail. The memory cell region MEC may include a plurality of vertical channel structures 200r, 200d1, and 200d2 penetrating a stack structure STC in the third direction (Z direction). The stack structure STC may include insulating layers 110 and gate electrodes 172 that are alternately and repeatedly stacked on the substrate 100.

The gate electrodes 172 may include an uppermost gate electrode 172b, a lowermost gate electrode 172a, and a gate electrode 172 therebetween. The lowermost and uppermost gate electrodes 172a and 172b may be used as gate electrodes of the selection transistors (GST and SST of FIG. 3), respectively. The gate electrodes 172 between the uppermost gate electrode 172b and the lowermost gate electrode 172a may be word lines.

The plurality of vertical channel structures 200r, 200d1, and 200d2 may extend in the third direction (Z direction). The plurality of vertical channel structures 200r, 200d1, and 200d2 may be arranged to be spaced apart from each other by a certain gap therebetween in the first direction (X direction) and the second direction (Y direction).

Among the vertical channel structures 200r, 200d1, and 200d2, the vertical channel structure 200r may be disposed in the real memory cell region RMC and may include an actually operating and/or operable memory cell. Accordingly, the vertical channel structure 200r may be referred to as a real vertical channel structure. For example, the real memory cell region RMC may include memory cells that are electrically active, that is, memory cells that may be read from and/or programmed from and/or erased during operation of the semiconductor device 10.

The real vertical channel structure 200r may be formed inside a third channel hole 124c penetrating the stack structure STC in the third direction (Z direction) and in a third recess region 124Rc recessed in the substrate 100. The real vertical channel structure 200r may include an information storage pattern 130, a fourth vertical channel pattern 140, and a filling insulating pattern 144 positioned on a third vertical channel pattern 128c. The third channel hole 124c may be referred to as a real channel hole.

A gate oxide layer 164 may be disposed on both side surfaces (or side walls) of the third vertical channel pattern 128c constituting the real vertical channel structure 200dr. The gate oxide layer 164 may surround the third vertical channel pattern 128c. The gate oxide layer 164 may be in contact with the lowermost gate electrode 172a.

A drain region 176 may be positioned on the real vertical channel structure 200r. The bit line BL may be connected on the drain region 176 through a wiring layer 180. The bit line BL may be disposed to extend in the second direction (Y direction).

Among the vertical channel structures 200r, 200d1, and 200d2, the vertical channel structures 200d1 and 200d2 may be disposed in the dummy memory cell region DMC and may include non-operating or non-operable dummy memory cells. Accordingly, the vertical channel structures 200d1 and 200d2 may be referred to as dummy vertical channel structures. For example, the dummy memory cell region DMC may include memory cells that are not electrically active, that is, memory cells that may not be read from and/or programmed from and/or erased during operation of the semiconductor device 10. For example, the vertical channel structures 200d1 and 200d2 may float (electrically float) during operation of the semiconductor device 10, and/or may provide structural support without being electrically active during operation of the semiconductor device 10.

The dummy vertical channel structures 200d1 and 200d2 may include a first dummy vertical channel structure 200d1 and a second dummy vertical channel structure 200d2. In some example embodiments, the first dummy vertical channel structure 200d1 may be positioned at an edge part of the memory cell region MEC in the first direction (X direction). The second dummy vertical channel structure 200d2 may be positioned inside the memory cell region MEC in the first direction (X direction).

The second dummy vertical channel structure 200d2 may be formed inside a second channel hole 124b penetrating the stack structure STC in the third direction (Z direction) and in a second recess region 124Rb recessed in the substrate 100. The second dummy vertical channel structure 200d2 may include the information storage pattern 130, the fourth vertical channel pattern 140, and the filling insulating pattern 144 positioned on the second vertical channel pattern 128b.

The gate oxide layer 164 may be disposed on both side surfaces (or side walls) of the second vertical channel pattern 128b constituting/included in the second dummy vertical channel structure 200d2. The gate oxide layer 164 may surround the second vertical channel pattern 128b. The gate oxide layer 164 may be in contact with the lowermost gate electrode 172a.

The first dummy vertical channel structure 200d1 may be formed inside the first channel hole 124a penetrating the stack structure STC in the third direction (Z direction) and in a first recess region 124Ra recessed in the substrate 100. The first dummy vertical channel structure 200d1 may include the information storage pattern 130, the fourth vertical channel pattern 140, and the filling insulating pattern 144 positioned on the first vertical channel pattern 128a. The first channel hole 124a and the second channel hole 124b may be referred to as a first dummy channel hole and a second dummy channel hole, respectively.

A protection pattern 111 may be positioned around the first dummy vertical channel structure 200d1 at a ground selection line level (a GSL level of FIG. 3, that is, a gate electrode level of the ground selection transistor GST). The protection pattern 111 may be positioned at an edge part of the dummy memory cell region DMC apart from the real memory cell region RMC. A protection pattern 111 may not be included in the real memory cell region RMC, and may only be included in the dummy memory cell region DMC.

As described below, the protection pattern 111 may protect a first vertical channel pattern (128a in FIG. 6) in contact with a substrate (not shown) while forming the first dummy vertical channel structure 200d1 at the ground selection line level (the GSL level of FIG. 3, that is, a level of the gate electrode 172a of the ground selection transistor GST).

When a voltage is applied to the stack structure STC, a leakage current may not be generated or may be reduced and/or inhibited from being generated to the substrate 100 by the protection pattern 111. Accordingly, the semiconductor device 10 may suppress or partially suppress or inhibit the leakage current from being generated, thereby improving the reliability of the memory cells. The configuration and manufacturing/fabrication method of the first dummy vertical channel structure 200d1 and the second dummy vertical channel structure 200d2 is described in more detail later.

Figure 5A:
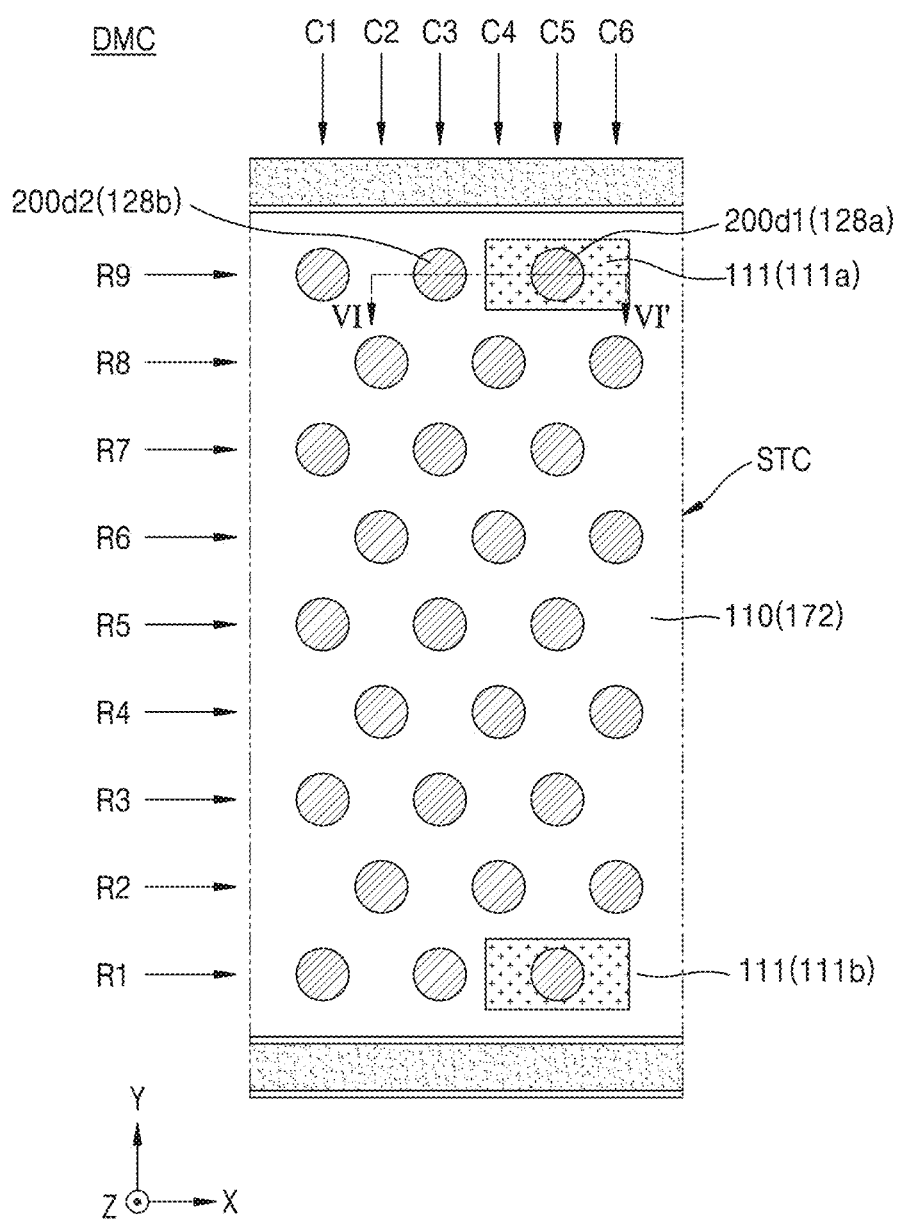
FIGS. 5A and 5B are plan views illustrating a dummy memory cell region of a semiconductor device according to an embodiment of inventive concepts.
Figure 5B:
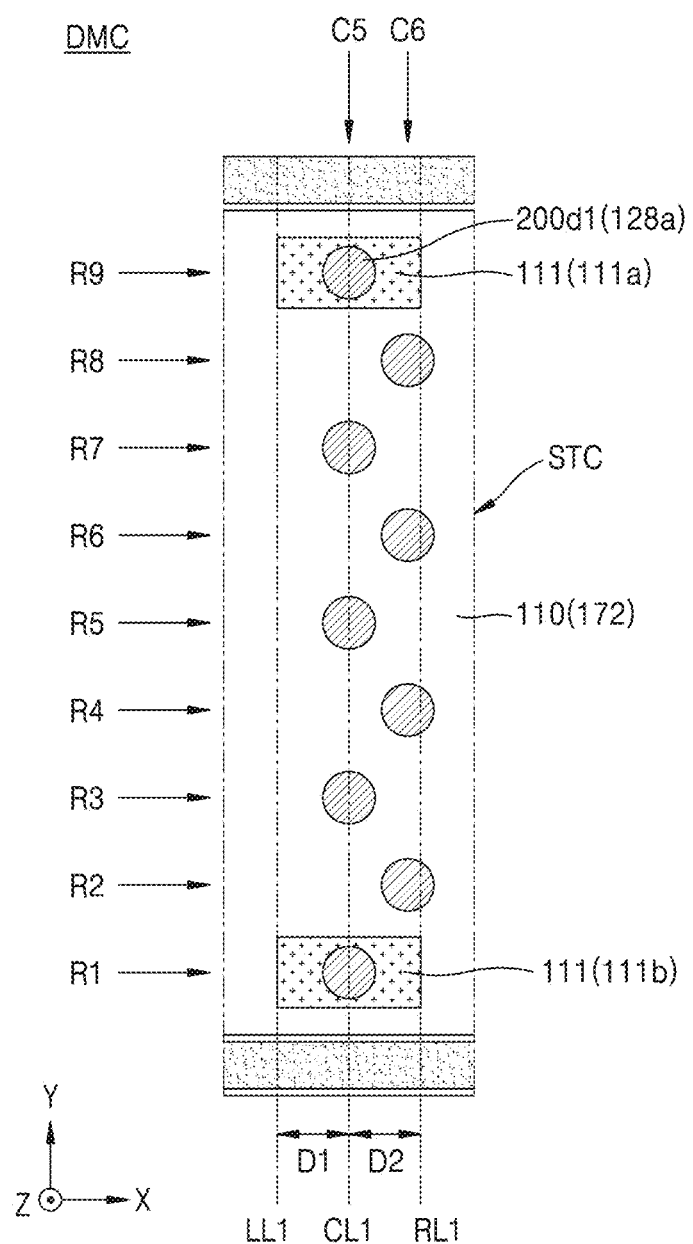

FIGS. 5A and 5B are plan views illustrating the dummy memory cell region DMC of a semiconductor device according to some example embodiments of inventive concepts.

In more detail, FIGS. 5A and 5B may be plan views of the dummy memory cell region DMC of FIG. 4. FIG. 5B may be a plan view partially illustrating the dummy memory cell region DMC of FIG. 5A. In FIGS. 5A and 5B, the same reference numerals as in FIG. 4 may denote the same members.

The plurality of dummy vertical channel structures 200d1 and 200d2 penetrating the stack structure STC in the third direction (Z direction) may be formed in the dummy memory cell region DMC. The stack structure STC may include the insulating layers 110 and the gate electrodes 172 that are alternately and repeatedly stacked on a substrate 100 as described below.

The dummy vertical channel structures 200d1 and 200d2 may be arranged along a first row R1 to a ninth row R9 in the first direction (e.g. the X direction). For example, the dummy vertical channel structures 200d1 and 200d2 of the first row R1 are spaced apart from the dummy vertical channel structures 200d1 and 200d2 of the second row R2 in the second direction (Y direction). Although the dummy vertical channel structures 200d1 and 200d2 are arranged in a repeating pattern, example embodiments are not limited thereto. The dummy vertical channel structures 200d1 and 200d2 may be arranged along a first column C1 to a sixth column C6 in the second direction (Y direction). For example, the dummy vertical channel structures 200d1 and 200d2 of the first column C1 are spaced apart from the dummy vertical channel structures 200d1 and 200d2 of the second column C2 in the first direction (X direction).

The dummy vertical channel structures 200d1 and 200d2 may be arranged in a zigzag form in the first direction (X direction). For example, the dummy vertical channel structures 200d1 and 200d2 of the first row R1 are not symmetrically arranged with the dummy vertical channel structures 200d1 and 200d2 of the second row R2 in the second direction (Y direction).

For example, the dummy vertical channel structures 200d1 and 200d2 of the second row R2 may be shifted from the dummy vertical channel structures 200d1 and 200d2 of the first row R1 in the first direction (X direction). The dummy vertical channel structures 200d1 and 200d2 of the first row R1 may be symmetrically arranged with the dummy vertical channel structures 200d1 and 200d2 of the third row R3 in the second direction (Y direction).

The dummy vertical channel structures 200d1 and 200d2 may be arranged in a zigzag form in the second direction (Y direction). For example, the dummy vertical channel structures 200d1 and 200d2 of the first column C1 are not symmetrically arranged with the dummy vertical channel structures 200d1 and 200d2 of the second column C2 in the first direction (X direction).

For example, the dummy vertical channel structures 200d1 and 200d2 of the second column C2 may be shifted from the dummy vertical channel structures 200d1 and 200d2 of the first column C1 in the second direction (Y direction). The dummy vertical channel structures 200d1 and 200d2 of the first column C1 may be symmetrically arranged with the dummy vertical channel structures 200d1 and 200d2 of the third column C3 in the first direction (X direction). The dummy vertical channel structures 200d1 and 200d2 are not limited to being arranged in 9 rows and 6 columns, and may be arranged in other numbers of rows and columns.

The dummy memory cell region DMC may include the first dummy vertical channel structure 200d1 and the second dummy vertical channel structure 200d2. The first dummy vertical channel structure 200d1 may be at an edge part of the memory cell region (MEC of FIG. 4) in the first direction (X direction). The second dummy vertical channel structure 200d2 may be in the memory cell region MEC in the first direction (X direction). The second dummy vertical channel structure 200d2 may include a second vertical channel pattern (128b of FIG. 6).

The protection pattern 111 may be positioned around the first dummy vertical channel structure 200d1 at the ground selection line level (the GSL level of FIG. 3). The protection pattern 111 may surround at least the first dummy vertical channel structure 200d1. The protection pattern 111 may surround the first vertical channel pattern (128a of FIG. 6) constituting or included in the first dummy vertical channel structure 200d1. The protection pattern 111 may protect the first vertical channel pattern 128a in contact with a substrate 100 while forming the first dummy vertical channel structure 200d1 at the ground selection line level (the GSL level of FIG. 3 and the level of the gate electrode 172a of the ground selection transistor GST of FIG. 6).

As shown in FIG. 5B, the protection pattern 111 may include a first protection pattern 111a positioned on an upper edge part and a second protection pattern 111b positioned on a lower edge part in the second direction (Y direction). The first protection pattern 111a and the second protection pattern 111b may be aligned in the second direction (Y direction). Both edges of the first protection pattern 111a may be aligned with both edges of the second protection pattern 111b in the second direction (Y direction), respectively. Some edges, e.g. left edges of the first protection pattern 111a and the second protection pattern 111b may have a same left edge line LL1 in the second direction (Y direction). Other edges, e.g., right edges of the first protection pattern 111a and the second protection pattern 111b may have a same right edge line RL1 in the second direction (Y direction).

As shown in FIG. 5B, a distance D1 from a center line CL1 of the first dummy vertical channel structure 200d1 to the left edge of the protection pattern 111 may be the same as a distance D2 from the center line CL1 of the first dummy vertical channel structure 200d1 to the right edge of the protection pattern 111.

In FIGS. 5A and 5B, the protection pattern 111 is illustrated as being disposed at an edge part of the dummy memory cell region DMC in the first direction (X direction), but may be disposed in a central part of the dummy memory cell region DMC if necessary.

FIGS. 6 to 9 are diagrams illustrating the semiconductor device 10 according to some example embodiments of inventive concepts.

Figure 6:
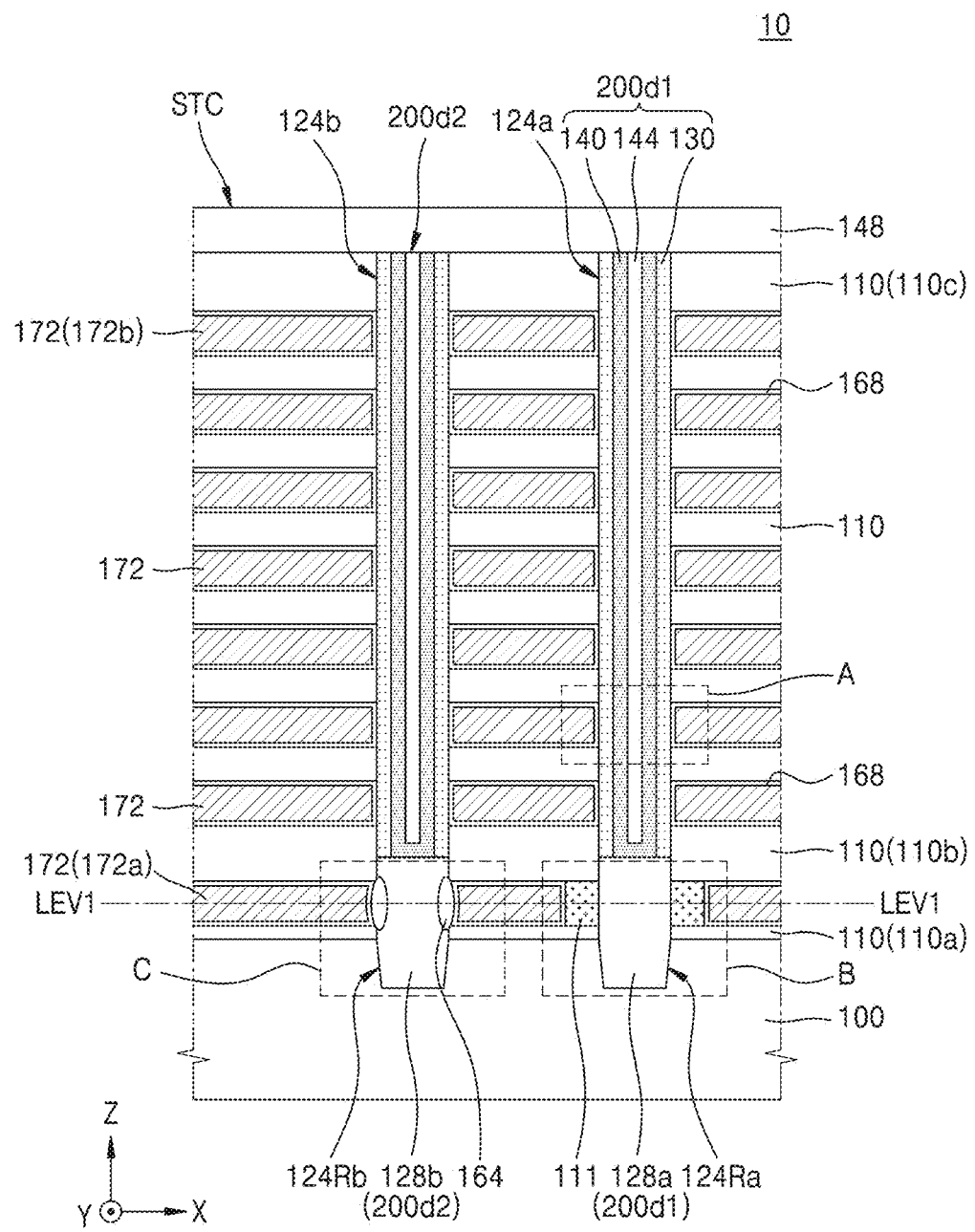
FIGS. 6 to 9 are diagrams illustrating a semiconductor device according to an embodiment of inventive concepts.
Figure 7:
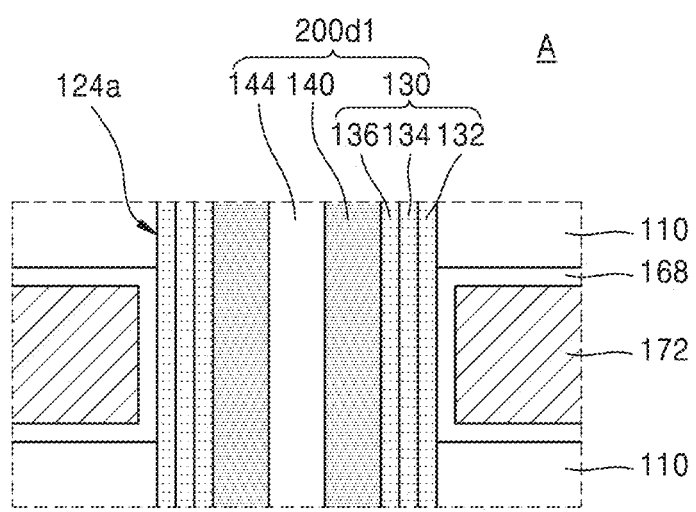
Figure 8:
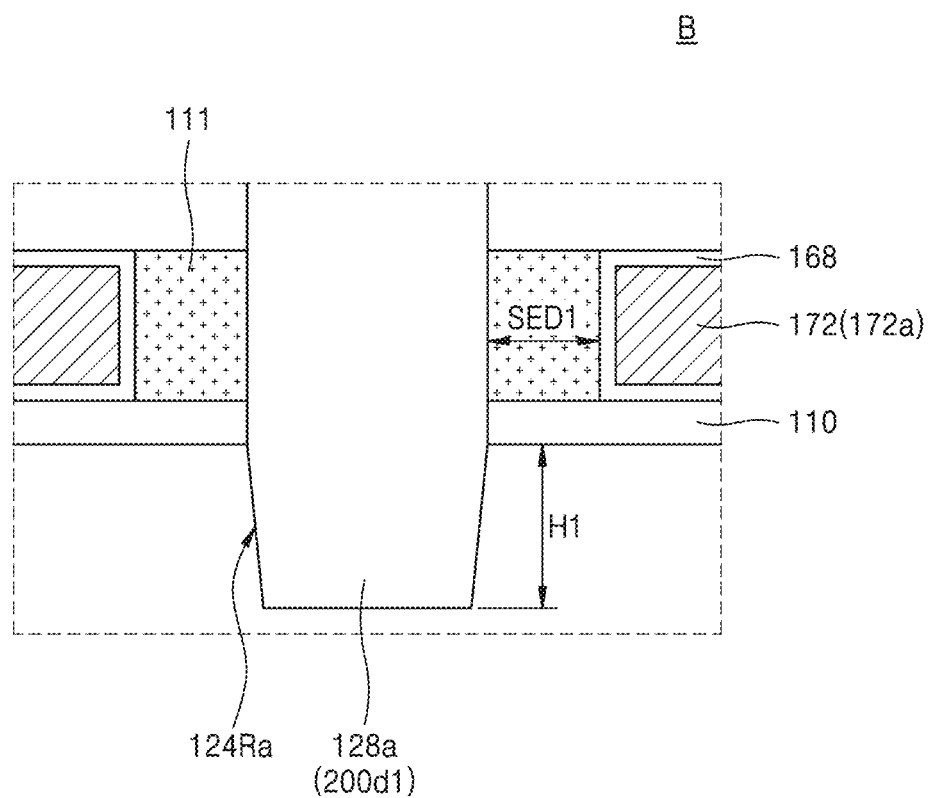
Figure 9:
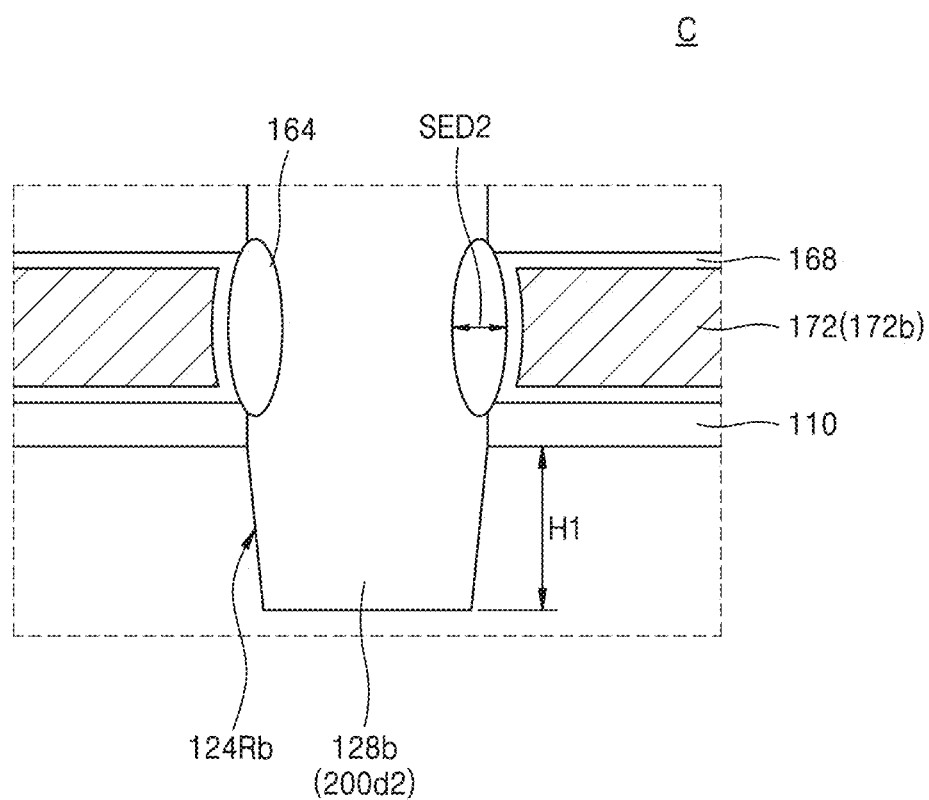

Specifically, FIG. 6 is a schematic cross-sectional view of the semiconductor device 10 of inventive concepts. FIG. 6 is a cross-sectional view taken along line VI-VI' of FIG. 5A. FIGS. 7 to 9 are enlarged views of a region "A", a region "B" and a region "C" of FIG. 6, respectively. In FIGS. 7 to 9, the same reference numerals as in FIGS. 4, 5A and 5B denote the same members.

The semiconductor device 10 may include the stack structure STC including the insulating layers 110 and the gate electrodes 172 that are alternately and repeatedly stacked on a substrate 100, and the first and second dummy vertical channel structures 200d1 and 200d2 penetrating the stack structure STC and spaced apart from each other in the first direction (X direction) parallel to a main surface of the substrate 100.

The first and second dummy vertical channel structures 200d1 and 200d2 may extend on the substrate 100 in the third direction (Z direction) perpendicular to the main surface of the substrate 100. The first and second dummy vertical channel structures 200d1 and 200d2 may extend into the substrate 100 while filling the first and second channel holes 124a and 124b, respectively. The semiconductor device 10 may be or may include a vertical semiconductor memory device.

The substrate 100 may include a semiconductor material. The substrate 100 may be a silicon single crystal substrate, a germanium single crystal substrate, or a silicon-germanium single crystal substrate. The substrate 100 may be a semiconductor on insulator (SOI) substrate. The substrate 100 may be a semiconductor layer, for example, a silicon layer, a silicon-germanium layer, or a germanium layer. A transistor may be further formed on the substrate 100. The substrate 100 may be a first conductivity type (e.g., P-type) semiconductor substrate; e.g. the substrate 100 may be lightly doped with or include an impurity such as boron; however, example embodiments are not limited thereto.

As illustrated in FIG. 6, the stack structure STC may have a line shape extending in the first direction (X direction). The second direction (Y direction) may be a direction perpendicular to the first direction (X direction). The first direction (X direction) and the second direction (Y direction) may be directions parallel to the main surface of the substrate 100. The plurality of insulating layers 110 may be arranged on the substrate 100 in the third direction (Z direction). The third direction (Z direction) may be a direction perpendicular to the first direction (X direction) and the second direction (Y direction). Thicknesses of the insulating layers 110 may be less than thicknesses of the gate electrodes 172.

In some example embodiments, the thickness of at least one of the insulating layers 110 may be greater than the thicknesses of the gate electrodes 172. For example, thicknesses of second insulating layer 110b and uppermost insulating layer 110c from the substrate 100 may be greater than the thicknesses of the gate electrodes 172. In some example embodiments, the thicknesses of the insulating layers 110 and the thicknesses of the gate electrodes 172 may be the same as each other. An insulating layer 110a in contact with the substrate 100 may have a smaller thickness than those of the other insulating layers 110 arranged thereon. The insulating layers 110 may include a silicon oxide layer.

The plurality of gate electrodes 172 may be arranged on the substrate 100 in the third direction (Z direction). The gate electrodes 172 may include control gate electrodes of memory cells included in a vertical semiconductor device (e.g., a vertical NAND flash memory device). The gate electrodes 172 between the uppermost gate electrode 172b and the lowermost gate electrode 172a may be word lines that are control gate electrodes.

The lowermost and uppermost gate electrodes 172a and 172b may be used as and/or be operable as gate electrodes of the selection transistors (GST and SST of FIG. 3). The uppermost gate electrode 172b may be used as a gate electrode of the string selection transistor (SST of FIG. 3). The lowermost gate electrode 172a may be used as a gate electrode of the ground selection transistor (GST of FIG. 3).

The gate electrodes 172 may be arranged between the insulating layers 110. The gate electrodes 172 may surround the dummy vertical channel structures 200d1 and 200d2. The gate electrodes 172 may include a conductive layer including a metal. The gate electrodes 172 may include a metal layer or a metal silicide layer.

The metal layer may be at least one of a tungsten layer, a nickel layer, a cobalt layer, a titanium layer, a platinum layer, or a tantalum layer. The metal silicide layer may include at least one of a nickel silicide layer, a platinum silicide layer, a cobalt silicide layer, a titanium silicide layer, a tungsten silicide layer, or a tantalum silicide layer.

The first and second dummy vertical channel structures 200d1 and 200d2 may penetrate the stack structure STC to be electrically connected to the substrate 100. The first and second dummy vertical channel structures 200d1 and 200d2 may penetrate the plurality of gate electrodes 172. Each of the gate electrodes 172 may surround the first and second dummy vertical channel structures 200d1 and 200d2.

The first dummy vertical channel structure 200d1 may include the first vertical channel pattern 128a, the information storage pattern 130, the fourth vertical channel pattern 140, and the filling insulating pattern 144. The second dummy vertical channel structure 200d2 may include the second vertical channel pattern 128b, the information storage pattern 130, the fourth vertical channel pattern 140, and the filling insulating pattern 144.

The information storage pattern 130, the fourth vertical channel pattern 140, and the filling insulating pattern 144 may be arranged on the first and second vertical channel patterns 128a and 128b. The first and second vertical channel patterns 128a and 128b may extend into the substrate 100.

The first vertical channel pattern 128a may be in contact with the substrate 100. The first vertical channel pattern 128a may have a pillar shape filled in the first recess region 124Ra formed in the substrate 100 and protruding upward from the substrate 100. The second vertical channel pattern 128b may have a pillar shape filled in the second recess region 124Rb formed in the substrate 100 and protruding upward from the substrate 100.

The first and second vertical channel patterns 128a and 128b may be arranged in a lower portion of the stack structure STC. Bottom surfaces of the first and second vertical channel patterns 128a and 128b may correspond to a depth H1 from an upper surface of the substrate 100. Upper surfaces of the first and second vertical channel patterns 128a and 128b may be arranged higher than an upper surface of the lowermost gate electrode 172a disposed adjacent to the substrate 100 (an upper surface of a gate electrode of a ground selection transistor).

The first and second vertical channel patterns 128a and 128b may be or may include semiconductor patterns epitaxially grown on the substrate 100, and may be referred to as epitaxial semiconductor patterns of the substrate 100. The first and second vertical channel patterns 128a and 128b may include silicon (Si), germanium (Ge), or a mixture/combination thereof. The first and second vertical channel patterns 128a and 128b may be epitaxial layers including single crystal silicon, and may be referred to as epitaxial semiconductor patterns of the substrate 100. The first and second vertical channel patterns 128a and 128b may include a semiconductor material undoped with impurities or a semiconductor material doped with impurities having the same conductivity type as that of the substrate 100.

The fourth vertical channel pattern 140 may be disposed on the first and second vertical channel patterns 128a and 128b. The fourth vertical channel pattern 140 may be disposed between the information storage pattern 130 and the filling insulating pattern 144. The fourth vertical channel pattern 140 may have an opened upper end and a hollow macaroni shape.

The fourth vertical channel pattern 140 may be in a pipe shape having opened upper end and lower end. The fourth vertical channel pattern 140 may have a cylindrical shape that is filled up without the filling insulation pattern 144. The fourth vertical channel pattern 140 may include a polycrystalline or polycrystalline semiconductor material.

The fourth vertical channel pattern 140 may include silicon (Si), germanium (Ge), or a mixture or combination thereof. The fourth vertical channel pattern 140 may be an epitaxial layer including single crystal silicon, and may be referred to as epitaxial semiconductor patterns of the substrate 100. The fourth vertical channel pattern 140 may include a semiconductor material undoped with impurities or a semiconductor material doped with impurities having the same conductivity type as that of the substrate 100.

The information storage pattern 130 may be disposed between the stack structure STC and the fourth vertical channel pattern 140. The information storage pattern 130 may be in a pipe shape having an opened upper end and an opened lower end. The information storage pattern 130 may include a first blocking insulating layer 132 adjacent to the gate electrodes 172, a tunnel insulating layer 136 adjacent to the fourth vertical channel pattern 140, and a charge storage layer 134 disposed therebetween.

The tunnel insulating layer 136 may be or may include a silicon oxide layer. The charge storage layer 134 may be or may include a trap insulating layer or an insulating layer including conductive nano dots. The trap insulating layer may include silicon nitride.

The first blocking insulating layer 132 may include a silicon oxide layer and/or a high-k layer (e.g., an aluminum oxide layer or a hafnium oxide layer). The first blocking insulating layer 132 may be a single layer or a multilayer layer including a plurality of thin films. The first blocking insulating layer 132 may be a single layer including a silicon oxide layer. The first blocking insulating layer 132 may include a plurality of thin films including an aluminum oxide layer and/or a hafnium oxide layer.

As described above, the semiconductor device 10 may include the first dummy vertical channel structure 200d1 and the second dummy vertical channel structure 200d2. The protection pattern 111 may be formed around the first vertical channel pattern 128a constituting or included in the first dummy vertical channel structure 200d1, and may or may not be formed around the second vertical channel pattern 128b. The protection pattern 111 may be disposed between the lowermost gate electrode 172a and the first vertical channel pattern 128a. The protection pattern 111 may be or may include an oxide layer.

The protection pattern 111 may be at the ground selection line level (the GSL level of FIG. 3 and the level of the gate electrode 172a of the ground selection transistor GST of FIG. 6) as indicated by LEV1 of FIG. 6. The protection pattern 111 may surround the first vertical channel pattern 128a constituting/included in the first dummy vertical channel structure 200d1. The protection pattern 111 may be in contact with the lowermost gate electrode 172a on the substrate 100.

The protection pattern 111 may protect the first vertical channel pattern 128a contacting the substrate 100 while forming the first dummy vertical channel structure 200d1 at the ground selection line level (the GSL level of FIG. 3 and the level of the gate electrode 172a of the ground selection transistor GST of FIG. 6).

The protection pattern 111 may be formed outside the first vertical channel pattern 128a constituting/included in the first dummy vertical channel structure 200d1. A thickness of a central part of the protection pattern 111 may be denoted by SED1.

The gate oxide layer 164 may be disposed on both side surfaces (or side walls) of the second vertical channel pattern 128b constituting/included in the second dummy vertical channel structure 200d2. The gate oxide layer 164 may surround the second vertical channel pattern 128b. The gate oxide layer 164 may be in contact with the lowermost gate electrode 172a.

The gate oxide layer 164 may be disposed between the lowermost gate electrode 172a and the second vertical channel pattern 128b. Because the gate oxide layer 164 is formed by oxidizing/partially consuming the second vertical channel pattern 128b, the gate oxide layer 164 may be formed by invading (intruding) into the second vertical channel pattern 128b. There may not be a gate oxide layer 164 surrounding the first vertical channel pattern 128a.

The gate oxide layer 164 constituting/included in the second dummy vertical channel structure 200d2 may have a thickness SED2 at a central part thereof. The thickness SED2 of the central part of the gate oxide layer 164 may be less than the thickness SED1 of the central part of the protection pattern 111.

The second blocking insulating layer 168 may extend between the insulating layers 110 and the gate electrodes 172. The second blocking insulating layer 168 may cover an upper surface, a lower surface, and one side of the gate electrodes 172 while substantially extending horizontally with respect to the substrate 100.

The second blocking insulating layer 168 may include a single layer or a plurality of thin films. The second blocking insulating layer 168 may include a high-k dielectric layer, for example, an aluminum oxide layer or a hafnium oxide layer. The second blocking insulating layer 168 may not be formed. The filling insulating pattern 144 may fill the inside of the first and second dummy vertical channel structures 200d1 and 200d2. The filling insulating pattern 144 may include a silicon oxide layer or a silicon nitride layer.

As described above, in the semiconductor device 10 of inventive concepts, the protection pattern 111 surrounding the first vertical channel pattern 128a may be positioned around the first dummy vertical channel structure 200d1 at the ground selection line level (the GSL level of FIG. 3, for example, the gate electrode level of the ground selection transistor). Accordingly, the semiconductor device 10 of inventive concepts may improve the reliability of the memory cells when a voltage is applied to the stack structure STC, and leakage current is not generated or is reduced from being generated to the substrate 100 by the protection pattern 111.

Figure 10A:
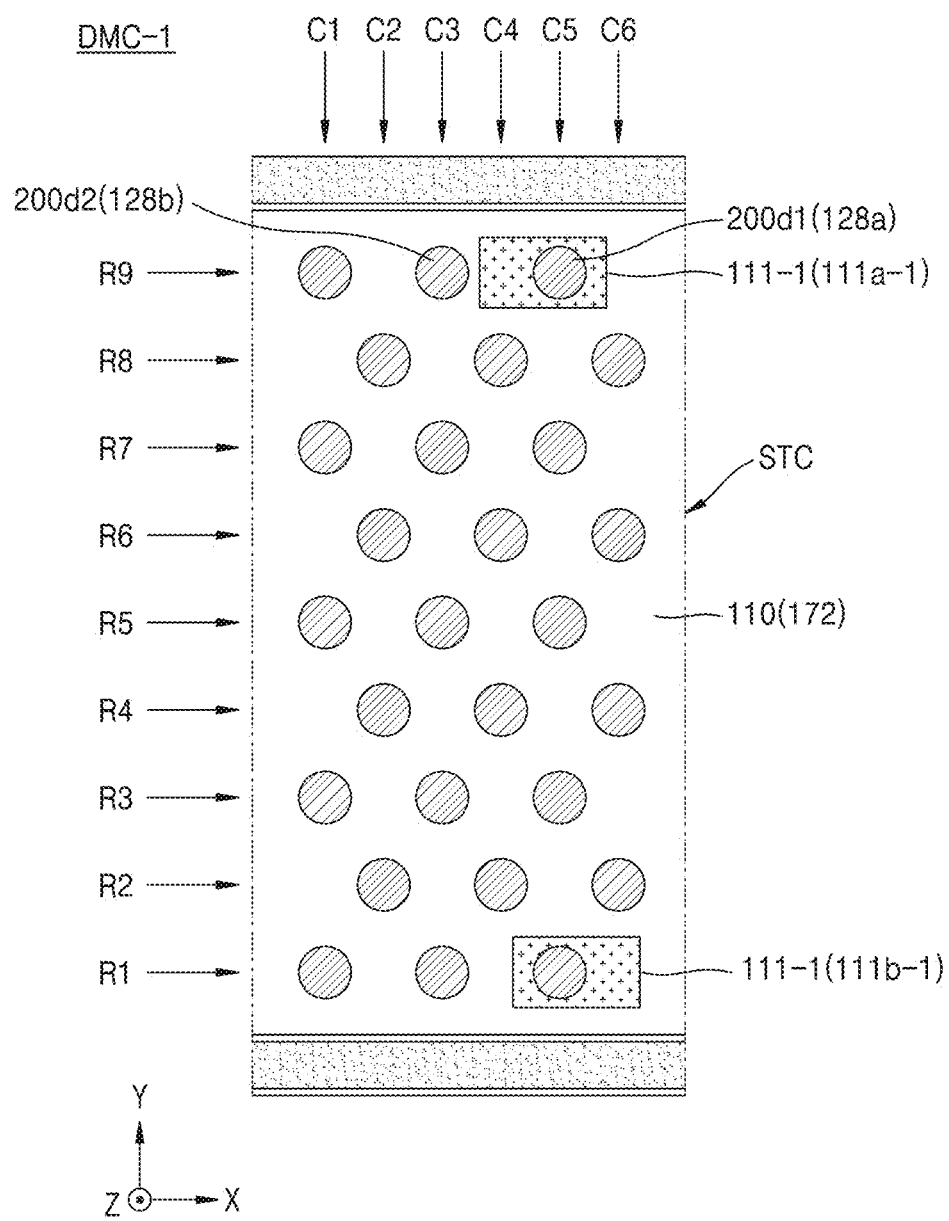
FIGS. 10A and 10B are plan views illustrating a dummy memory cell region of a semiconductor device according to an embodiment of inventive concepts.
Figure 10B:
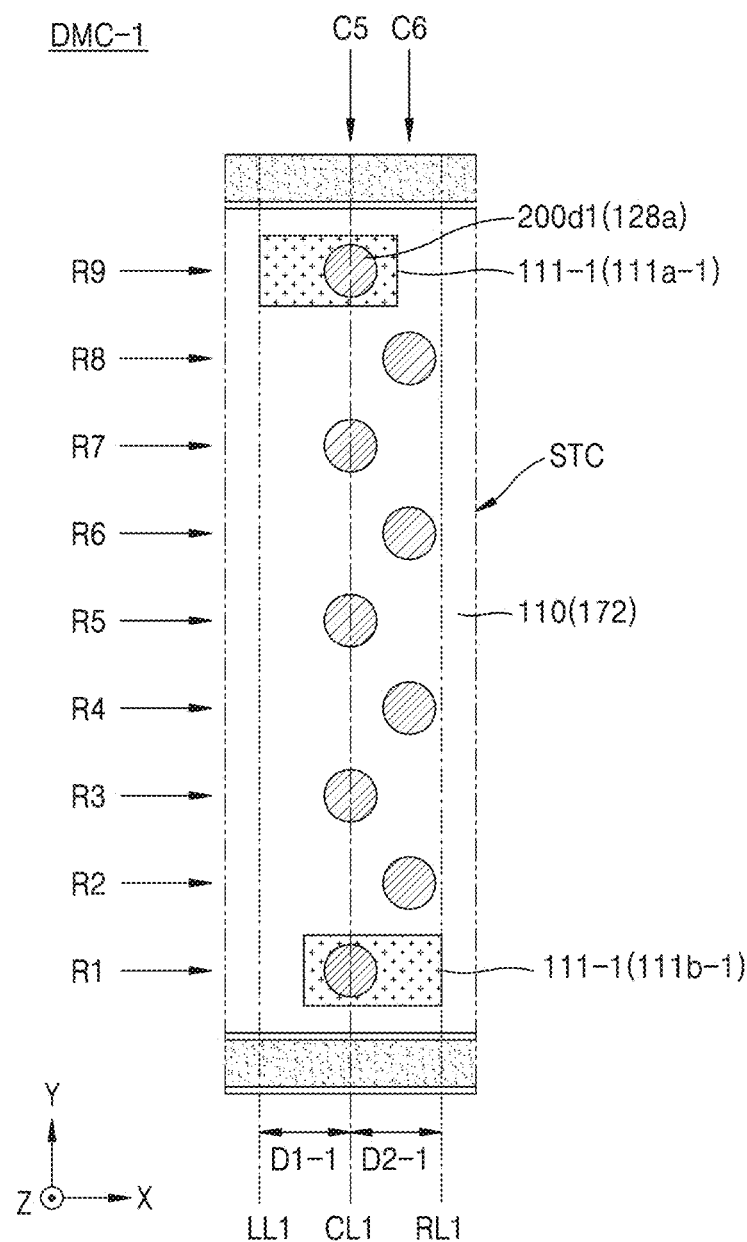

FIGS. 10A and 10B are plan views illustrating a dummy memory cell region DMC-1 of a semiconductor device according to some example embodiments of inventive concepts.

In more detail, the dummy memory cell region DMC-1 may be the same as the dummy memory cell region DMC of FIGS. 5A and 5B except that an arrangement of a protection pattern 111-1 is different. FIG. 10B may be a plan view partially illustrating the dummy memory cell region DMC-1 of FIG. 10A.

In FIGS. 10A and 10B, the same or similar descriptions to those of FIGS. 5A and 5B will be briefly given or omitted. In FIGS. 10A and 10B, the same or similar reference numerals as in FIGS. 5A and 5B denote the same or similar members.

The plurality of dummy vertical channel structures 200d1 and 200d2 penetrating the stack structure STC in the third direction (Z direction) may be formed in the dummy memory cell region DMC-1. The stack structure STC may include the insulating layers 110 and the gate electrodes 172 that are alternately and repeatedly stacked on a substrate 100. The arrangement of the dummy vertical channel structures 200d1 and 200d2 has been described above, and thus, a description thereof is omitted herein.

The dummy vertical channel structures 200d1 and 200d2 may include the first dummy vertical channel structure 200d1 and the second dummy vertical channel structure 200d2. The protection pattern 111-1 may be positioned around the first dummy vertical channel structure 200d1 at the ground selection line level (the GSL level of FIG. 3 and the gate electrode 172a level of the ground selection transistor of FIG. 6) of the semiconductor device. The protection pattern 111-1 may surround the first vertical channel pattern (128a of FIG. 6) constituting the first dummy vertical channel structure 200d1.

The protection pattern 111-1 may include a first protection pattern 111a-1 positioned on an upper side in the second direction (Y direction) and a second protection pattern 111b-1 positioned on a lower side. The first protection pattern 111a-1 and the second protection pattern 111b-1 may not be aligned in the second direction (Y direction). Both edges of the first protection pattern 111a-1 may not be aligned with both edges of the second protection pattern 111b-1 in the second direction (Y direction), respectively. The first protection pattern 111a-1 may be shifted in the first direction (−X direction), and the second protection pattern 111b-1 may be shifted in the first direction (+X direction).

As shown in FIG. 10B, left edges of the first protection pattern 111a-1 and the second protection pattern 111b-1 may have the left edge lines LL1 that are not identical in the second direction (Y direction). Right edges of the first protection pattern 111a and the second protection pattern 111b may have the right edge lines RL1 that are not identical in the second direction (Y direction).

A distance D1-1 from the center line CL1 of the first dummy vertical channel structure 200d1 to the left edge of the protection pattern 111-1 may be the same as a distance D2-1 from the center line CL1 of the first dummy vertical channel structure 200d1 to the right edge of the protection pattern 111.

Figure 11:
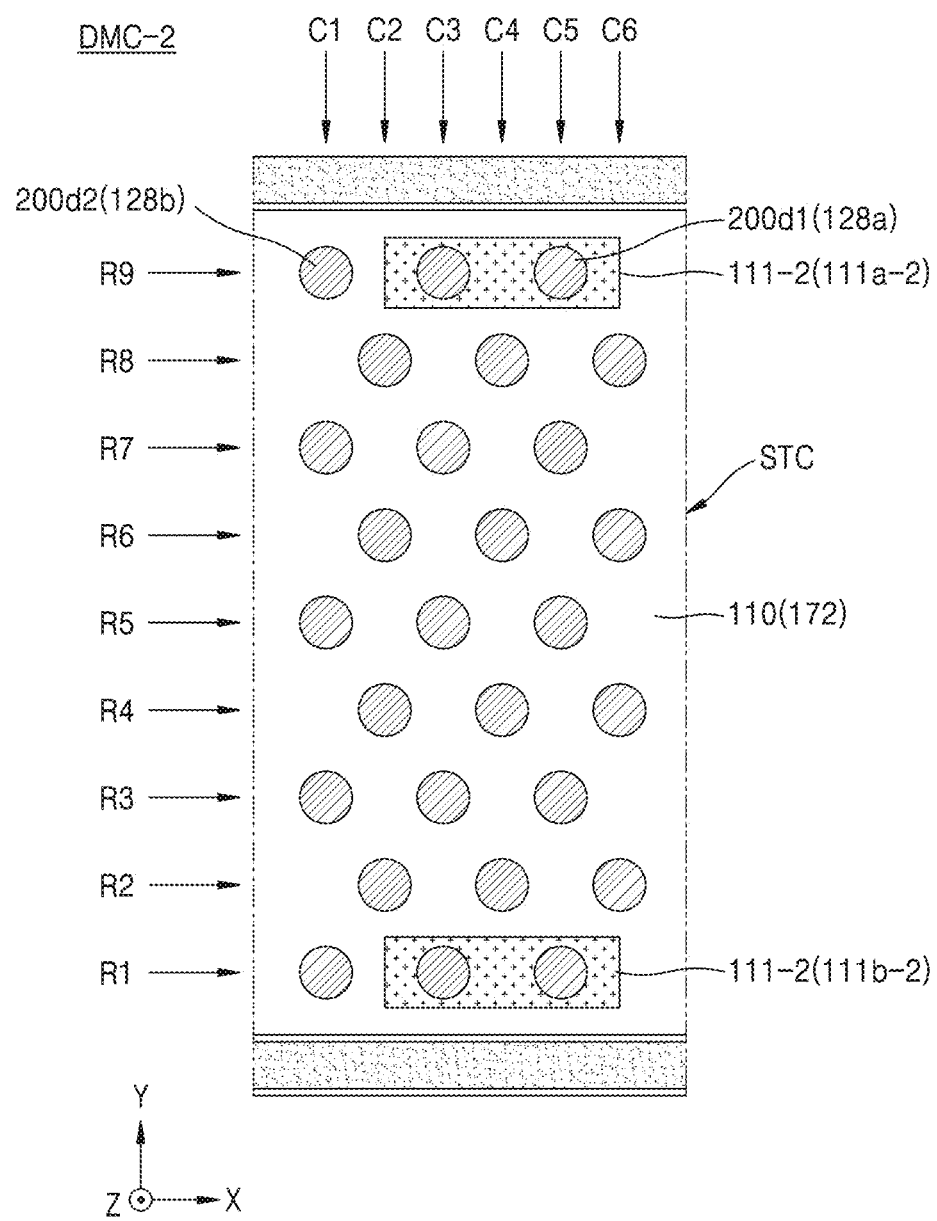
FIG. 11 is a plan view illustrating a dummy memory cell region of a semiconductor device according to an embodiment of inventive concepts.

FIG. 11 is a plan view illustrating a dummy memory cell region DMC-2 of a semiconductor device according to some example embodiments of inventive concepts.

In more detail, the dummy memory cell region DMC-2 may be the same as the dummy memory cell region DMC of FIGS. 5A and 5B except that an arrangement of a protection pattern 111-2 is different. In FIG. 11, the same or similar descriptions as those of FIGS. 5A and 5B will be briefly given or omitted. In FIG. 11, the same or similar reference numerals as those of FIGS. 5A and 5B denote the same or similar members.

The plurality of dummy vertical channel structures 200d1 and 200d2 penetrating the stack structure STC in the third direction (Z direction) may be formed in the dummy memory cell region DMC-2. The stack structure STC may include the insulating layers 110 and the gate electrodes 172 that are alternately and repeatedly stacked on a substrate (not shown). The arrangement of the dummy vertical channel structures 200d1 and 200d2 has been described above, and thus, a description thereof is omitted herein.

The dummy vertical channel structures 200d1 and 200d2 may include the first dummy vertical channel structure 200d1 and the second dummy vertical channel structure 200d2. The protection pattern 111-2 may be positioned around the two first dummy vertical channel structures 200d1 adjacent to each other in the first direction (X-direction) at the ground selection line level (the GSL level of FIG. 3 and the gate electrode 172a level of the ground selection transistor of FIG. 6). The protection pattern 111-2 may surround the two first vertical channel patterns (128a of FIG. 6) constituting the two first dummy vertical channel structures 200d1.

The protection pattern 111-2 may include a first protection pattern 111a-2 positioned on an upper side in the second direction (Y direction) and a second protection pattern 111b-2 positioned on a lower side. The first protection pattern 111a-2 and the second protection pattern 111b-2 may be aligned in the second direction (Y direction). Both edges of the first protection pattern 111a-2 may be aligned with both edges of the second protection pattern 111b-2 in the second direction (Y direction), respectively.

In FIG. 11, the protection pattern 111-2 is illustrated as an integrated pattern surrounding the two first dummy vertical channel structures 200d1 adjacent to each other in the first direction (X direction), but the protection pattern 111-2 may be disposed in a separate pattern surrounding each of the two first dummy vertical channel structures 200d1 adjacent to each other in the first direction (X-direction).

In FIG. 11, the protection pattern 111-2 is illustrated as an integrated pattern surrounding the two first dummy vertical channel structures 200d1 adjacent to each other in the first direction (X direction), but the protection pattern 111-2 may be disposed in an integrated pattern surrounding each of the two first dummy vertical channel structures 200d1 adjacent to each other in the second direction (Y direction).

In FIG. 11, the protection pattern 111-2 is illustrated as being disposed at an edge part of the dummy memory cell region DMC-2 in the first direction (X direction), but may be disposed in a central part of the dummy memory cell region DMC-2 if necessary.

Figure 12:
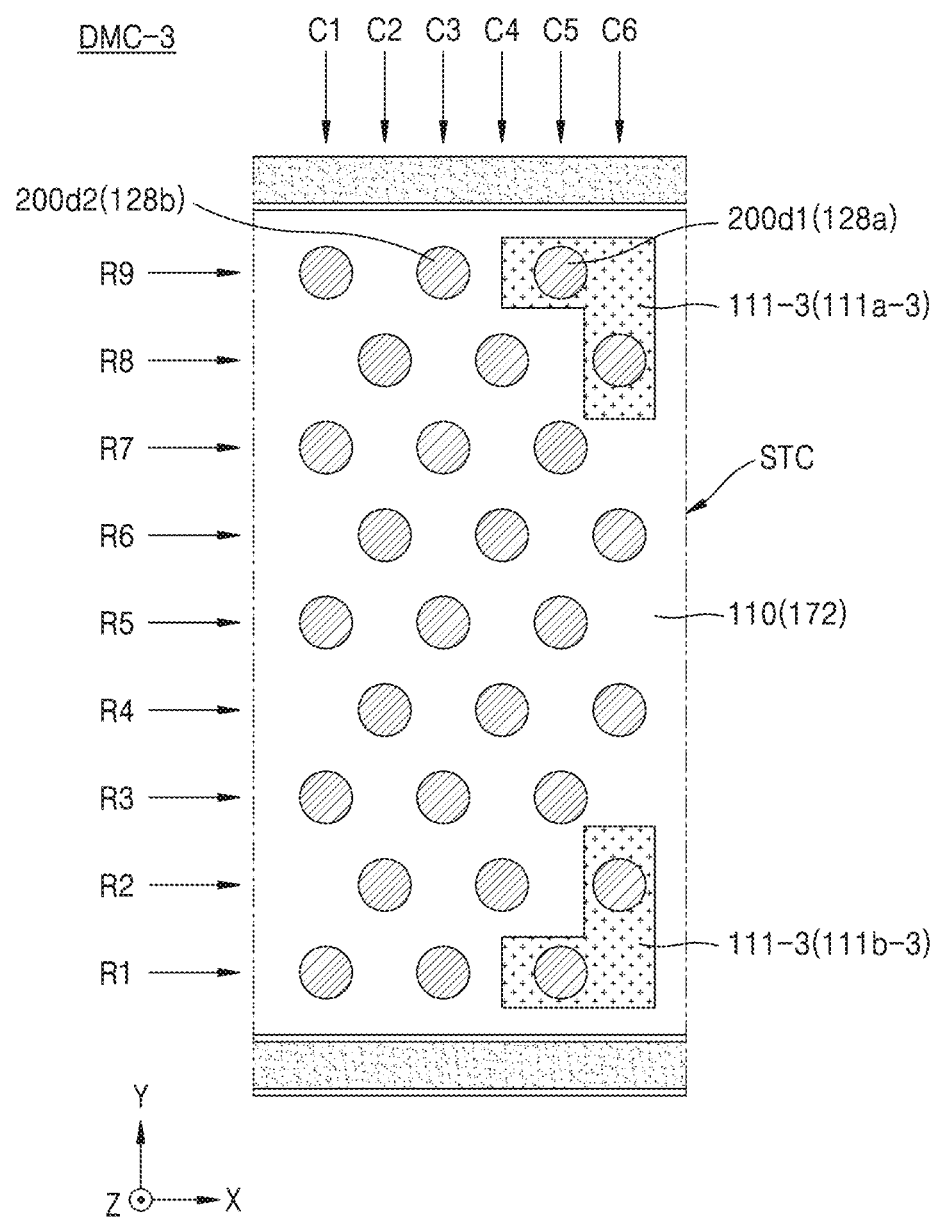
FIG. 12 is a plan view illustrating a dummy memory cell region of a semiconductor device according to an embodiment of inventive concepts.

FIG. 12 is a plan view illustrating a dummy memory cell region DMC-3 of a semiconductor device according to some example embodiments of inventive concepts.

Specifically, the dummy memory cell region DMC-3 may be the same as the dummy memory cell region DMC of FIGS. 5A and 5B except that an arrangement of a protection pattern 111-3 is different. In FIG. 12, the same or similar descriptions as those of FIGS. 5A and 5B will be briefly given or omitted. In FIG. 12, the same or similar reference numerals as those of FIGS. 5A and 5B denote the same or similar members.

The plurality of dummy vertical channel structures 200d1 and 200d2 penetrating the stack structure STC in the third direction (Z direction) may be formed in the dummy memory cell region DMC-3. The stack structure STC may include the insulating layers 110 and the gate electrodes 172 that are alternately and repeatedly stacked on a substrate (not shown). The arrangement of the dummy vertical channel structures 200d1 and 200d2 has been described above, and thus, a description thereof is omitted herein.

The dummy vertical channel structures 200d1 and 200d2 may include the first dummy vertical channel structure 200d1 and the second dummy vertical channel structure 200d2. The protection pattern 111-3 may be positioned around the two first dummy vertical channel structures 200d1 adjacent to each other in the first direction (X-direction) and the second direction (Y direction) at the ground selection line level (the GSL level of FIG. 3 and the gate electrode 172a level of the ground selection transistor of FIG. 6). The protection pattern 111-3 may surround the two first vertical channel patterns (128a of FIG. 6) constituting the two first dummy vertical channel structures 200d1. The protection pattern 111-3 may be in a clamp shape.

The protection pattern 111-3 may include a first protection pattern 111a-3 positioned on an upper side in the second direction (Y direction) and a second protection pattern 111b-3 positioned in a lower side. The first protection pattern 111a-3 and the second protection pattern 111b-3 may be symmetrical to each other in the second direction (Y direction). Both edges of the first protection pattern 111a-3 may be aligned with both edges of the second protection pattern 111b-3 in the second direction (Y direction), respectively.

In FIG. 12, the protection pattern 111-3 is illustrated as an integral pattern surrounding the two adjacent first dummy vertical channel structures 200d1 arranged in the first direction (X direction) and the second direction (Y direction) and adjacent to each other, but the protection pattern 111-3 is disposed as a separate pattern surrounding each of the two adjacent first dummy vertical channel structures 200d1 arranged in the first direction (X direction) and the second direction (Y direction) and adjacent to each other.

In FIG. 12, the protection pattern 111-3 is illustrated as being disposed at an edge part of the dummy memory cell region DMC-3 in the first direction (X direction), but the protection pattern 111-3 may be disposed in a central part of the dummy memory cell region DMC-3 if necessary.

FIGS. 13 to 17B are cross-sectional views illustrating a method of manufacturing the semiconductor device 10 according to some example embodiments. FIGS. 13 to 17B are cross-sectional views illustrating a method of manufacturing the semiconductor device 10 of FIGS. 6 to 9.

In FIGS. 13 to 17B, the same or similar descriptions as those of FIGS. 6 to 9 will be briefly given or omitted. In FIGS. 13 to 17B, the same or similar reference numerals as those of FIGS. 6 to 9 denote the same or similar members.

Figure 13:
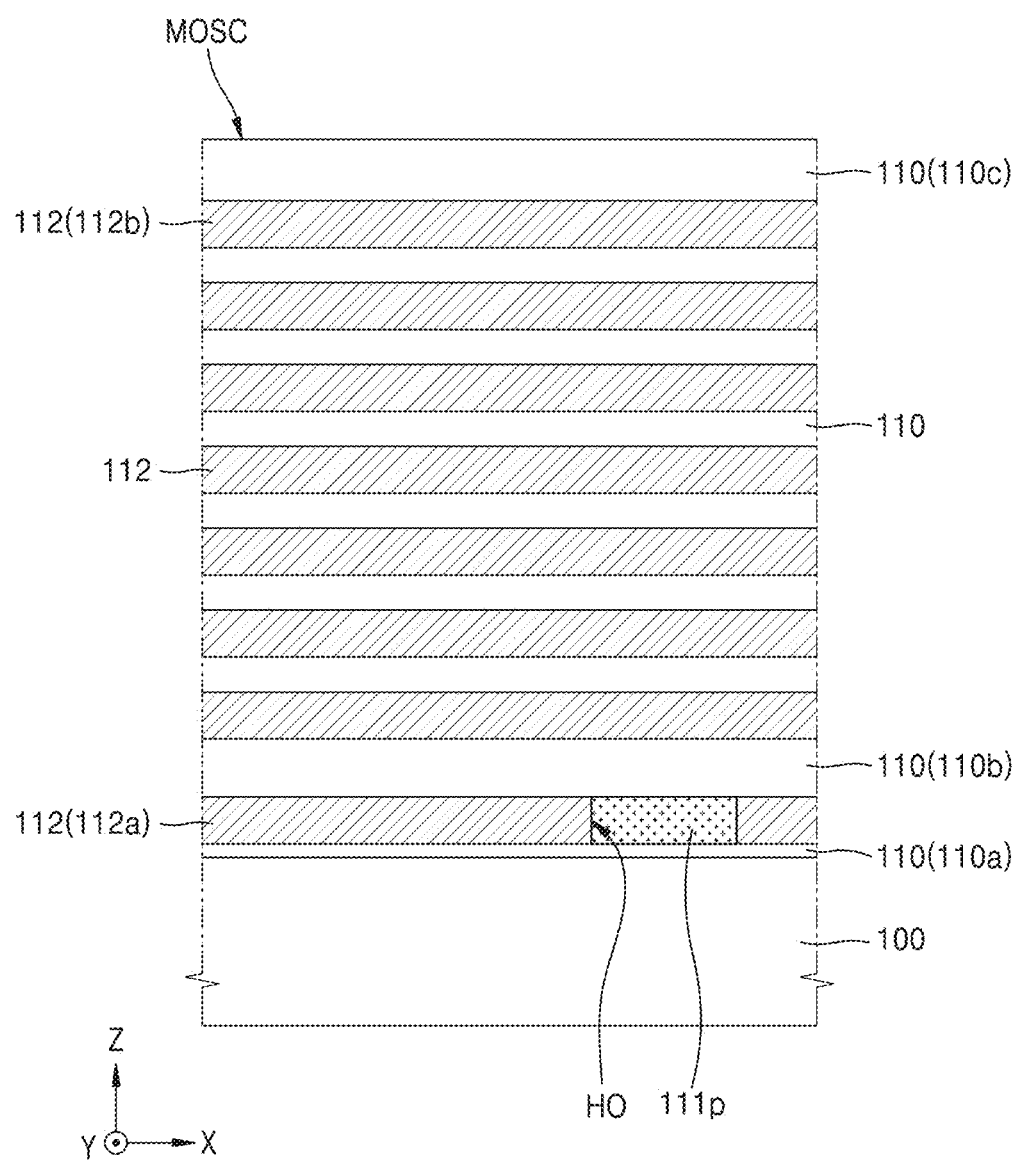
FIGS. 13 to 17B are cross-sectional views illustrating a method of manufacturing a semiconductor device according to an embodiment.

Referring to FIG. 13, a molding structure MOSC and a protection layer 111p are formed on the substrate 100. The insulating layer 110 and a sacrificial layer 112 are sequentially formed on the substrate 100. The protection layer 111p is formed in the sacrificial layer 112 by patterning the sacrificial layer 112 on the insulating layer 110.

For example, the sacrificial layer 112 is patterned using a photolithography process to form a contact hole HO exposing a part of the lowermost insulating layer 110a. The protection layer 111p is formed in the contact hole HO. Accordingly, the sacrificial layer 112 may be a lowermost sacrificial layer 112a. The plurality of insulating layers 110 and sacrificial layers 112 are alternately and repeatedly stacked on the lowermost sacrificial layer 112a and the protection layer 111p to complete the molding structure MOSC. An uppermost sacrificial layer 112b may be formed on an uppermost layer of the sacrificial layer 112.

The sacrificial layers 112 may include a material having etch selectivity with respect to the insulating layers 110 and the protection layer 111p. The sacrificial layers 112 may have a high etch selectivity in a wet etching process using a chemical solution compared to the insulating layers 110 and the protection layer 111p. The insulating layers 110 and the protection layer 111p may be a silicon oxide layer or a silicon nitride layer. The sacrificial layers 112 may be selected from a silicon oxide layer, a silicon nitride layer, silicon carbide, silicon, and silicon germanium.

The sacrificial layers 112 may include a material having an etch selectivity with respect to the insulating layers 110 and the protection layer 111p. The insulating layers 110 and the protection layer 111p may be silicon oxide layers, and the sacrificial layers 120 may be silicon nitride layers.

The insulating layers 110, the protection layer 111p, and the sacrificial layers 112 may be formed using at least one of a thermal chemical vapor deposition (CVD), plasma enhanced CVD, or atomic layer deposition (ALD) technology.

The sacrificial layers 112 may have the same thickness; however, example embodiments are not limited thereto. The lowermost insulating layer 110a in contact with the substrate 100 may be a silicon oxide layer formed using a thermal oxidation process or a deposition process, and may be formed to be thinner than the other insulating layers 110 formed thereon. The second intermediate insulating layer 110b and the uppermost insulating layer 110c stacked on the substrate 100 may be formed to be thicker than the sacrificial layers 112 disposed therebetween.

Figure 14:
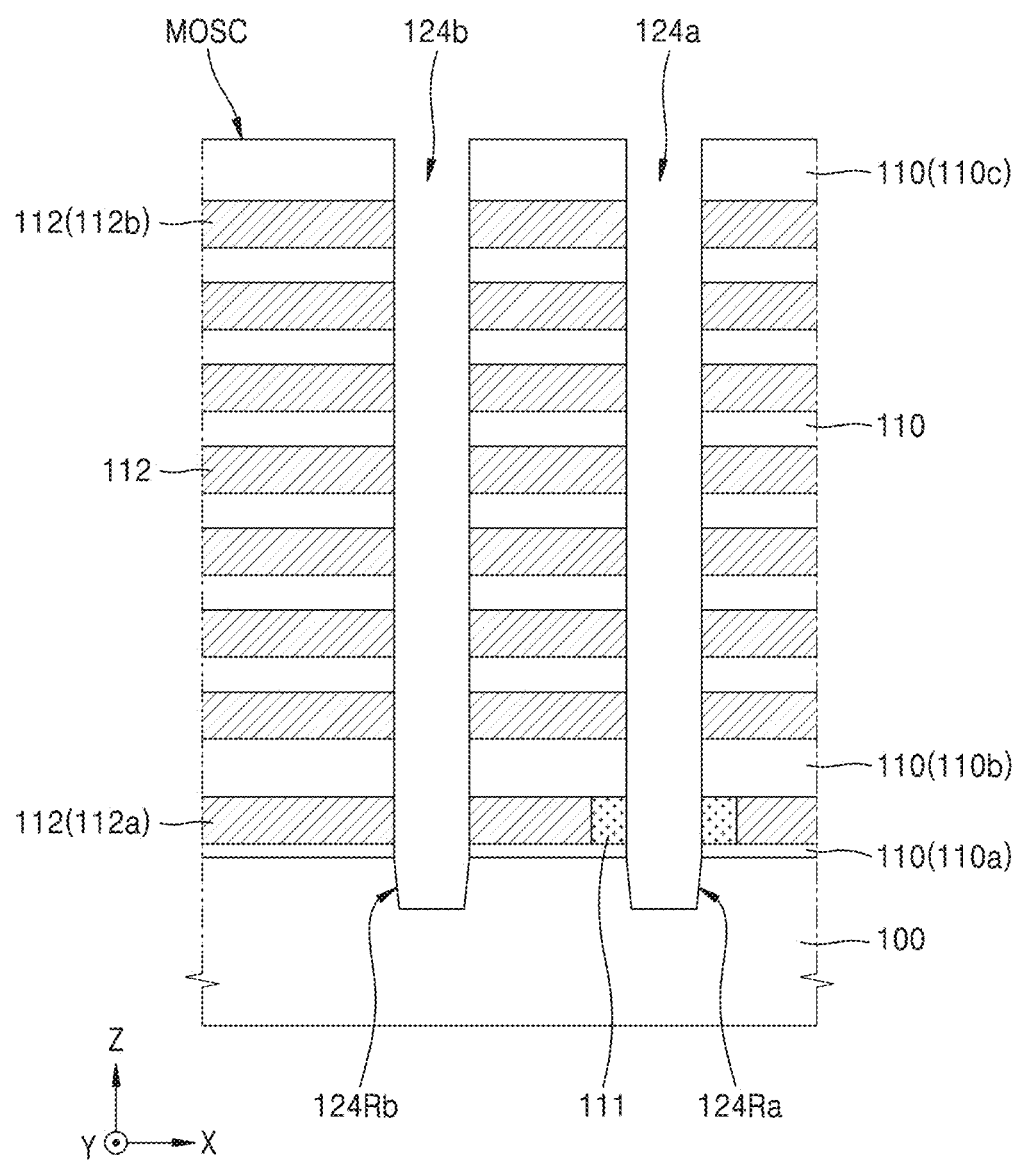

Referring to FIG. 14, the first and second channel holes 124a and 124b penetrating the molding structure MOSC and the protection layer (111p of FIG. 13) and exposing the substrate 100 are formed. The first and second channel holes 124a and 124b may be formed by forming a mask pattern (not shown) on the molding structure MOSC, and anisotropically etching the molding structure MOSC and the protection layer (111p of FIG. 13) using the mask pattern (not shown) as an etch mask, e.g. using a dry etching process.

When the first and second channel holes 124a and 124b are formed, the substrate 100 may be over-etched so that a first recess region 124Ra and a second recess region 124Rb may be formed. The substrate 100 may be etched to a depth D1 so that the first recess region 124Ra and the second recess region 124Rb may be formed. For example, the depth D1 may be several nanometers (nm) to several hundreds of nanometers (nm). The first recess region 124Ra and the second recess region 124Rb may have inclined side surfaces.

When the first channel hole 124a is formed, the protection layer (111p in FIG. 3) is etched so that the protection pattern 111 may be formed. The first channel hole 124a may be formed by penetrating the protection layer (111p in FIG. 3). One side of the protection pattern 111 may contact the lowermost sacrificial layer 112a, and the other side of the protection pattern 111 may contact the first channel hole 124a. After the first and second channel holes 124a and 124b are formed, the mask pattern may be removed.

Figure 15A:
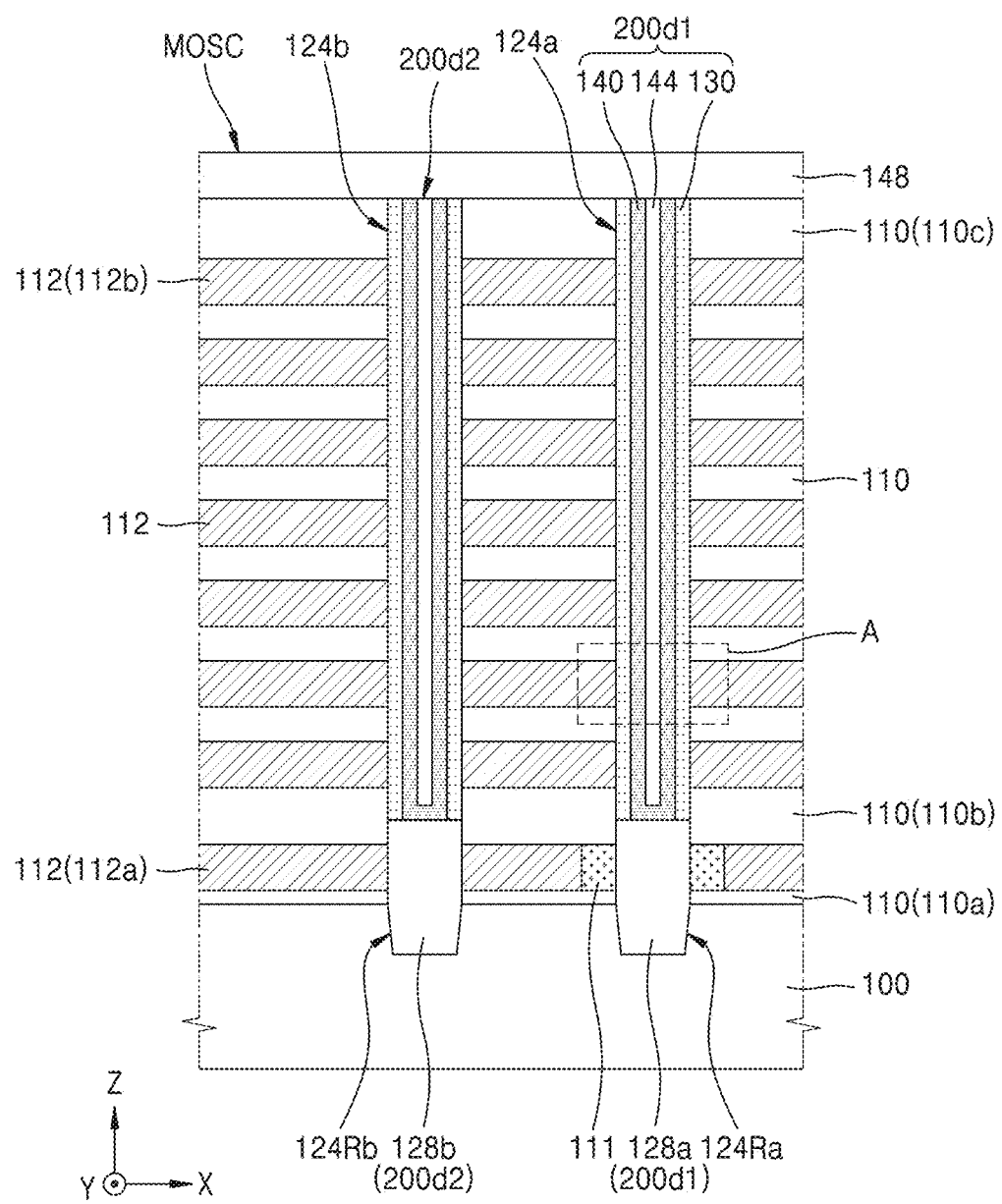
Figure 15B:
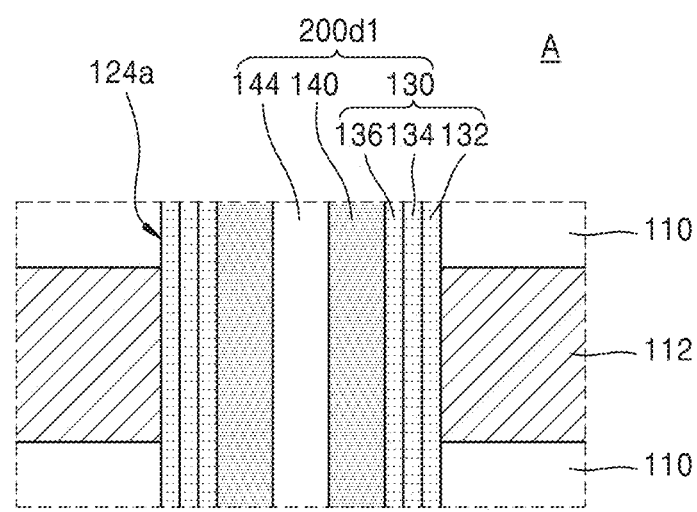

Referring to FIGS. 15A and 15B, FIG. 15B may be an enlarged view of region "A" of FIG. 15A. The first and second dummy vertical channel structures 200d1 and 200d2 penetrating through the molding structure MOSC and extending in the third direction (Z direction) may be formed on the substrate 100. The first and second dummy vertical channel structures 200d1 and 200d2 may be filled in the first and second channel holes 124a and 124b, respectively, and extend into the substrate 100.

The first dummy vertical channel structure 200d1 may include the first vertical channel pattern 128a, the information storage pattern 130, the fourth vertical channel pattern 140, and the filling insulating pattern 144. The first vertical channel pattern 128a may be filled in the first recess region 124Ra and formed to protrude upward from the substrate 100 in a pillar shape.

The first vertical channel pattern 128a may be filled in a lower portion of the first channel hole 124a. The first vertical channel pattern 128a may be formed inside the protection pattern 111. Both side surfaces of the first vertical channel pattern 128a may be in contact with the protection pattern 111.

The second dummy vertical channel structure 200d2 may include the second vertical channel pattern 128b, the information storage pattern 130, the fourth vertical channel pattern 140, and the filling insulating pattern 144. The second vertical channel pattern 128b may be filled in the second recess region 124Rb and formed to protrude upward from the substrate 100 in a pillar shape. The second vertical channel pattern 128b may be filled in a lower portion of the second channel hole 124b.

The first and second vertical channel patterns 128a and 128b may be in contact with side surfaces of the lowermost insulating layer 110a and the lowermost sacrificial layer 112a of the molding structure MOSC, and protrude upward from the substrate 100 to cover a partial side surface of the second insulating layer 110b from the substrate 100.

Upper surfaces of the first and second vertical channel patterns 128a and 128b may be lower than an upper surface of the second insulating layer 110b from the substrate 100. The first and second vertical channel patterns 128a and 128b may be semiconductor patterns. The first and second vertical channel patterns 128a and 128b may be formed through selective epitaxial growth (SEG) of a semiconductor material.

The first and second vertical channel patterns 128a and 128b may include impurities of the same conductivity type as that of the substrate 100. The first and second vertical channel patterns 128a and 128b may be in-situ doped with impurities when formed through the selective epitaxial growth. Alternatively or additionally, the first and second vertical channel patterns 128a and 128b may be ion-injected with impurities.

Subsequently, the information storage pattern 130, the fourth vertical channel pattern 140, and the filling insulating pattern 144 are formed on the first and second vertical channel patterns 128a and 128b. The information storage pattern 130 may cover inner walls of the first and second channel holes 124a and 124b. The information storage pattern 130 may be formed in the form of a spacer on the inner walls of the first and second channel holes 124a and 124b. The information storage pattern 130 may extend from upper ends of the first and second channel holes 124a and 124b to upper surfaces of the first and second vertical channel patterns 128a and 128b.

The information storage pattern 130 may be in a pipe shape having opened upper end and lower end. The information storage pattern 130 may contact the insulating layers 110 and the sacrificial layers 112 of the molding structure MOSC. The information storage pattern 130 may be formed as a plurality of thin films.

The information storage pattern 130 may include a first blocking insulating layer 132, a charge storage layer 134, and a tunnel insulating layer 136 as shown in FIG. 15B. The first blocking insulating layer 132, the charge storage layer 134, and the tunnel insulating layer 136 may be sequentially formed from the inner walls of the first and second channel holes 124a and 124b.

The first blocking insulating layer 132 may include a silicon oxide layer and/or a high dielectric layer (e.g., an aluminum oxide layer or a hafnium oxide layer). The first blocking insulating film 132 may be a single layer or a multilayer including a plurality of thin films. The first blocking insulating layer 132 may be a single layer including a silicon oxide layer. The first blocking insulating layer 132 may include a plurality of thin films including an aluminum oxide layer and/or a hafnium oxide layer.

The charge storage layer 134 may be a trap insulating layer or an insulating layer including conductive nano dots. The trap insulating layer may include silicon nitride. The tunnel insulating layer 136 may be or may include a silicon oxide layer.

The first blocking insulating layer 132 and the charge storage layer 134 may be formed using plasma enhanced CVD and/or atomic layer deposition (ALD) technology. The tunnel insulating layer 136 may be formed using at least one of a plasma enhanced CVD, ALD, or a thermal oxidation process. The tunnel insulating layer 136 may be in contact with the fourth vertical channel pattern 140.

The fourth vertical channel pattern 140 may be connected to the first and second vertical channel patterns 128a and 128b and may contact the information storage pattern 130. The fourth vertical channel pattern 140 may be conformally formed in a liner shape in the first and second channel holes 124a and 124b. The fourth vertical channel pattern 140 may have an opened upper end and a hollow macaroni shape. The fourth vertical channel pattern 140 may be in a pipe shape having opened upper end and lower end.

The fourth vertical channel pattern 140 may have a cylindrical shape filled in the first and second channel holes 124a and 124b without the filling insulation pattern 144. The fourth vertical channel pattern 140 may include a semiconductor material. The fourth vertical channel pattern 140 may include any one of a polycrystalline semiconductor material, an amorphous semiconductor material, or a single crystal semiconductor material.

The fourth vertical channel pattern 140 may include silicon (Si), germanium (Ge), or a mixture or combination thereof. The fourth vertical channel pattern 140 may be an undoped semiconductor material that does not include impurities or a semiconductor material that includes impurities having the same conductivity type as that of the substrate 100. The fourth vertical channel pattern 140 may be formed using atomic layer deposition (ALD) and/or chemical vapor deposition (CVD).

The filling insulation pattern 144 may be formed to fill the inside of the first and second channel holes 124a and 124b in which the fourth vertical channel pattern 140 is formed. The filling insulating pattern 144 may include a silicon oxide layer or a silicon nitride layer. A cap insulating layer 148 may be formed on the first and second dummy vertical channel structures 200d1 and 200d2 and the uppermost insulating layer 110c.

Figure 16A:
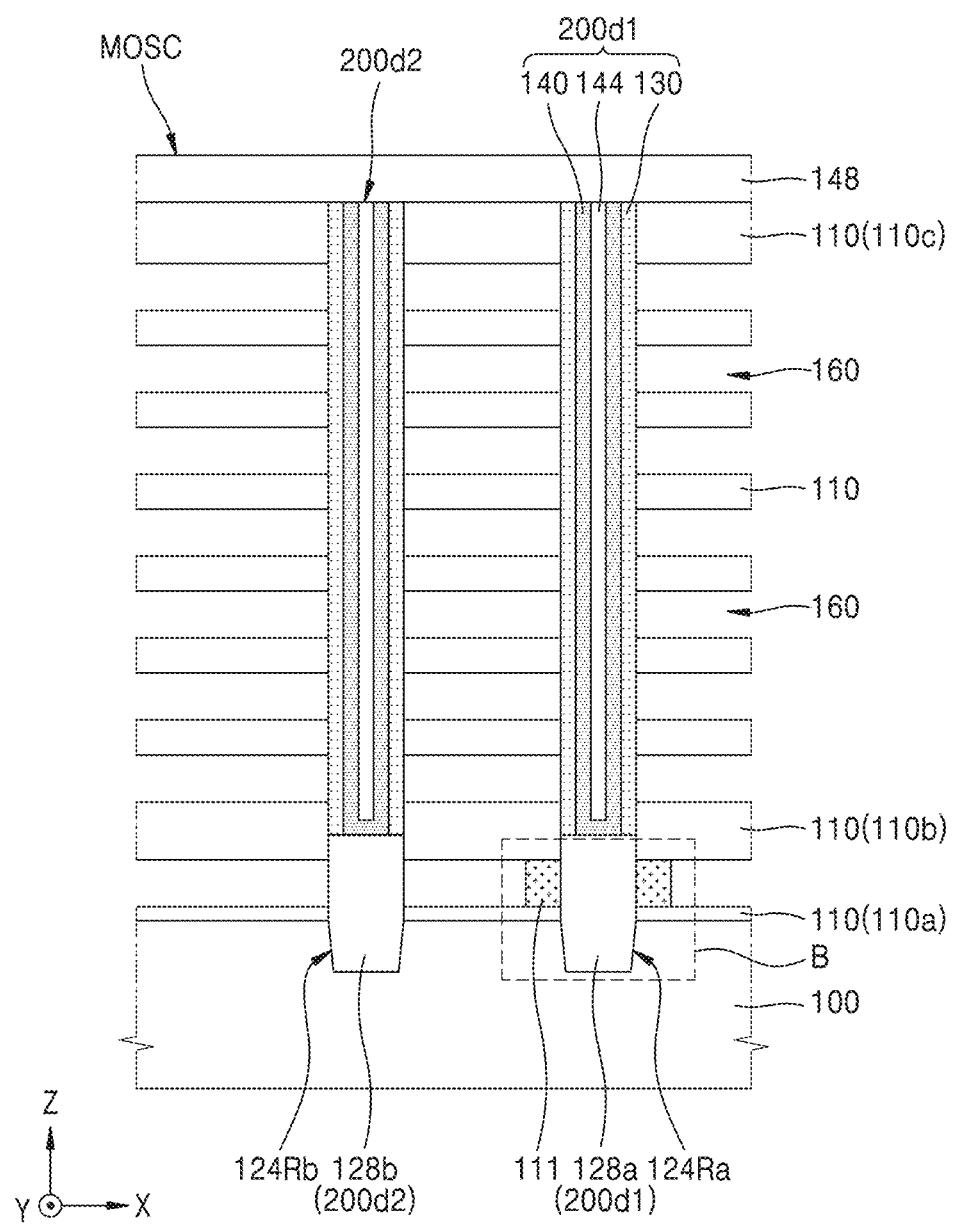
Figure 16B:
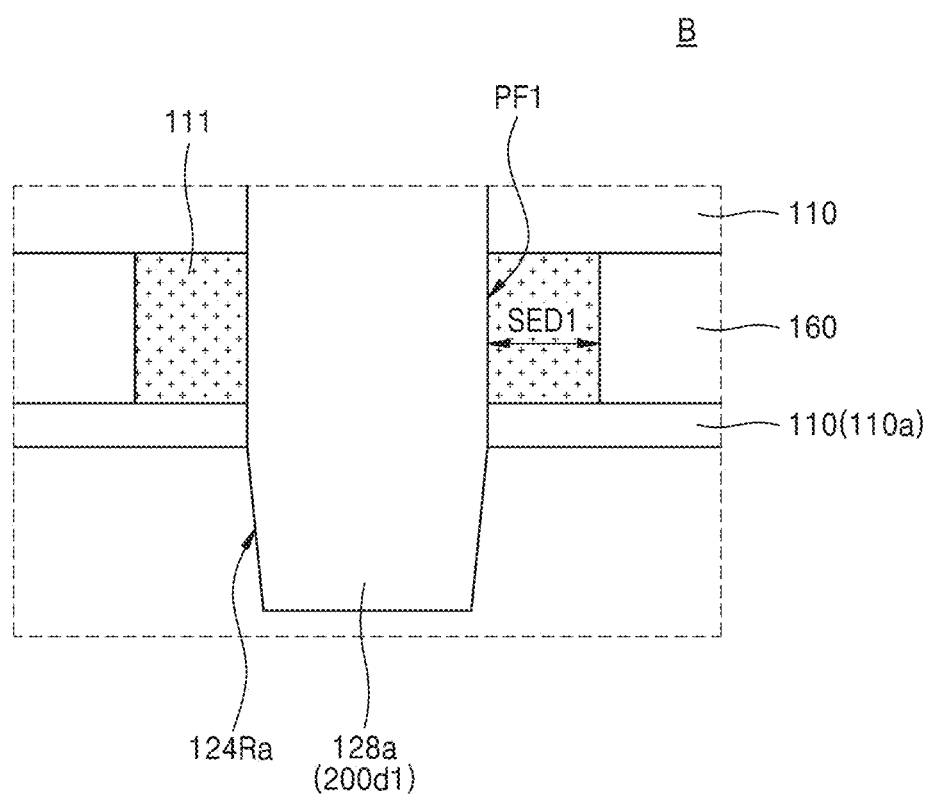

Referring to FIGS. 16A and 16B, FIG. 16B may be an enlarged view of region "B" of FIG. 16A. An opening region 160 may be formed in the molding structure MOSC. By removing the sacrificial layers 112, the opening region 160 may be formed between the insulating layers 110. When the sacrificial layers 112 are silicon nitride layers and the insulating layers 110 and the protection pattern 111 are silicon oxide layers, the opening region 160 may be formed by isotropically etching the sacrificial layers 112 using an etchant including phosphoric acid, e.g. using a wet etching process.

The opening region 160 may be a region in which a gate electrode is to be formed. The first and second dummy vertical channel structures 200d1 and 200d2 may be partially exposed by the opening region 160. One side of the protection pattern 111 may be exposed by the opening region 160. The information storage pattern 130 of the first and second dummy vertical channel structures 200d1 and 200d2 may be exposed.

The first blocking insulating layer (132 of FIG. 15B) of the information storage pattern 130 may be exposed. Side surfaces of the protection pattern 111 and side surfaces of the third vertical channel pattern 128 may be exposed by the opening region 160. The opening region 160 may extend in the second direction (Y direction) horizontally with respect to the main surface of the substrate 100.

As shown in FIG. 16B, the protection pattern 111 may be formed to protrude toward the outside of the first vertical channel pattern 128a. The protection pattern 111 may be formed to surround the circumference of the first vertical channel pattern 128a constituting the first dummy vertical channel structure 200d1. The first vertical channel pattern 128a may be protected by the protection pattern 111.

Both side surfaces PF1 of the first vertical channel pattern 128a may have vertical surfaces perpendicular to the third direction (Z direction). Both side surfaces PF1 of the first vertical channel pattern 128a may be vertical surfaces in a vertical direction (Z direction) perpendicular to the surface of the substrate 100. The thickness of the protection pattern 111, for example, the thickness of a center part, may be denoted by SED1. SED1 may be several to several tens of nanometers (nm).

Figure 17A:
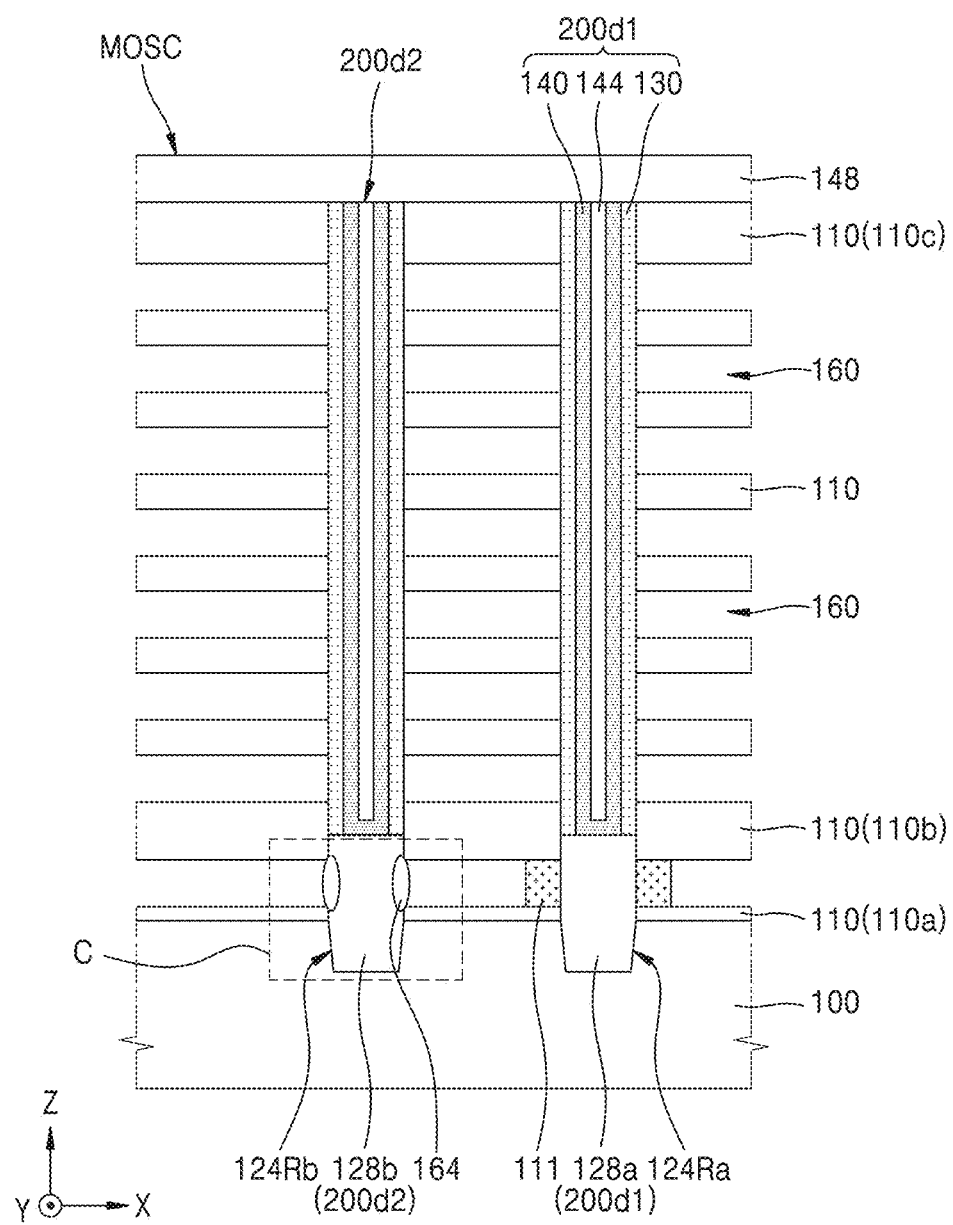
Figure 17B:
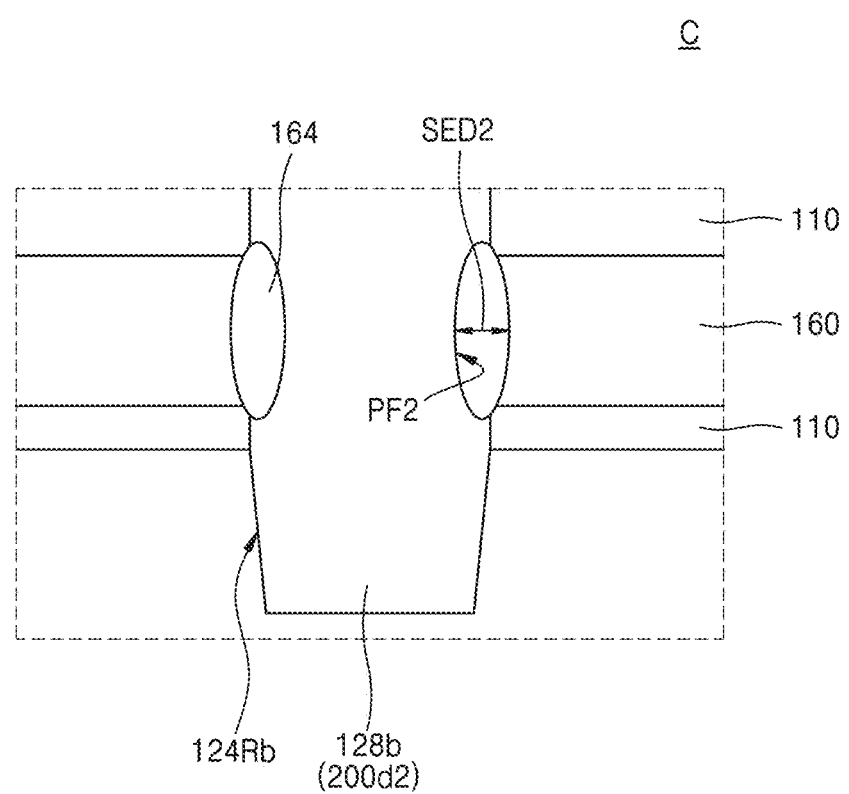

Referring to FIGS. 17A and 17B, FIG. 17B may be an enlarged view of region "C" of FIG. 17A. The gate oxide layers 164 may be formed on both side surfaces of the second vertical channel pattern 128b. Both side surfaces of the second vertical channel pattern 128b exposed by the opening region 160 may be oxidized to form the gate oxide layer 164.

Both side surfaces of the second vertical channel pattern 128b may be oxidized through a thermal oxidation process. When both side surfaces of the second vertical channel pattern 128b are thermally oxidized, both side surfaces of the first vertical channel pattern 128a are protected by the protection pattern 111. Accordingly, both side surfaces of the first vertical channel pattern 128a may not be oxidized.

Because the gate oxide layer 164 is formed by an oxidation process, the gate oxide layer 164 may be formed by penetrating into the second vertical channel pattern 128b. Both side surfaces PF2 of the second vertical channel pattern 128b may have curved surfaces in the third direction (Z direction). Both side surfaces PF2 of the second vertical channel pattern 128b may have curved surfaces in the vertical direction (Z direction) perpendicular to the surface of the substrate 100.

The gate oxide layer 164 may have the thickness SED2 at the center as shown in FIG. 17B. SED2 may be several to several tens of nanometers (nm). The thickness SED2 of a center part of the gate oxide layer 164 may be smaller than a thickness (SED1 in FIG. 167B) of a center part of the protection pattern 111.

Subsequently, referring back to FIGS. 6 to 9, a second blocking insulating layer 168 and a gate conductive layer 170 may be sequentially formed on the substrate 100 so as to be filled in the opening region 160. The second blocking insulating layer 168 may be formed to conformally cover the inner wall of the opening region 160. The second blocking insulating layer 168 may be in contact with upper and lower surfaces of the insulating layers 110. The second blocking insulating layer 168 may be in contact with sidewalls of the first and second dummy vertical channel structures 200d1 and 200d2.

The second blocking insulating layer 168 may be in contact with the first blocking insulating layer 132. The second blocking insulating layer 168 may be in contact with the protection pattern 111 formed on both sides of the first vertical channel pattern 128a. The second blocking insulating layer 168 may be in contact with the gate oxide layer 164 of the second vertical channel pattern 128b. The second blocking insulating layer 168 may not be formed and be omitted.

The gate electrode 172 may be formed to fill the opening region 160 in which the second blocking insulating layer 168 is formed. The gate electrode 172 may include a conductive layer including a metal. The gate electrode 172 may include a metal layer or a metal silicide layer.

The metal layer may be formed using atomic layer deposition (ALD) and/or chemical vapor deposition (CVD). The metal silicide layer may be formed by depositing a polysilicon layer and a metal layer that are filled in the opening region 160, and silicidizing the polysilicon layer and the metal layer by heat treatment/annealing.

As shown in FIG. 6, through the manufacturing process, the stack structure STC including the insulating layers 110 and the gate electrodes 172 that are alternately and repeatedly stacked on the substrate 100, and the first and second dummy vertical channel structures 200d1 and 200d2 penetrating the stack structure STC and spaced apart from each other in the first direction (X direction) may be formed.

Figure 18:
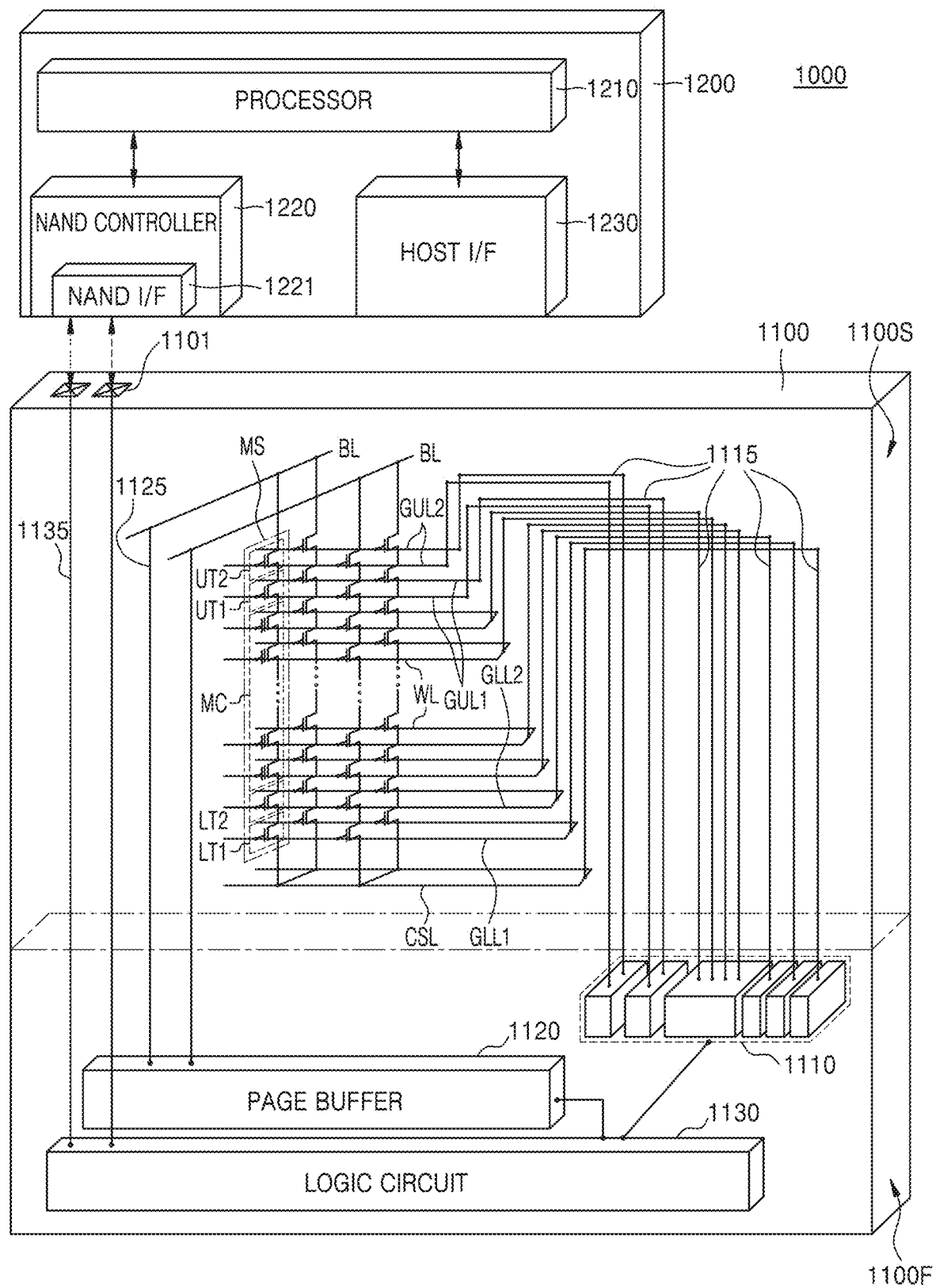
FIG. 18 is a diagram schematically illustrating an electronic system including a semiconductor device according to an embodiment of inventive concepts.

FIG. 18 is a diagram schematically illustrating an electronic system 1000 including a semiconductor device 1100 according to some example embodiments of inventive concepts.

Specifically, the electronic system 1000 according to some example embodiments of inventive concepts may include the semiconductor device 1100 and a controller 1200 electrically connected to the semiconductor device 1100. The electronic system 1000 may be a storage device including one or a plurality of semiconductor devices 1100 or an electronic device including a storage device. For example, the electronic system 1000 may be a solid state drive device (SSD) including at least one semiconductor device 1100, a universal serial bus (USB), a computing system, a medical device, or a communication device.

The semiconductor device 1100 may be or may include a nonvolatile memory device. For example, the semiconductor device 1100 may be a NAND flash memory device including the semiconductor device 10 with reference to FIGS. 4 to 17B. The semiconductor device 1100 may include a first structure 1100F and a second structure 1100S on the first structure 1100F. In embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including the bit line BL, the common source line CSL, the plurality of word lines WL, first and second gate upper lines GUL1 and GUL2, first and second gate lower lines GLL1 and GLL2, and the plurality of memory cell strings MS between the bit line BL and the common source line CSL.

In the second structure 1100S, each of the plurality of memory cell strings MS may include lower transistors LT1 and LT2 adjacent to the common source line CSL, upper transistors UT1 and UT2 adjacent to the bit line BL, and a plurality of memory cell transistors MC arranged between the lower transistors LT1 and LT2 and the upper transistors UT1 and UT2. The number of lower transistors LT1 and LT2 and the number of upper transistors UT1 and UT2 may be modified in various ways according to embodiments.

In embodiments, the upper transistors UT1 and UT2 may include the string selection transistor SST, and the lower transistors LT1 and LT2 may include the ground selection transistor GST. The plurality of gate lower lines GLL1 and GLL2 may be gate electrodes of the lower transistors LT1 and LT2, respectively. The word line WL may be a gate electrode of the memory cell transistor MC, and the gate upper lines GUL1 and GUL2 may be gate electrodes of the upper transistors UT1 and UT2, respectively.

The common source line CSL, the plurality of gate lower lines GLL1 and GLL2, the plurality of word lines WL, and the plurality of gate upper lines GUL1 and GUL2 may be electrically connected to the decoder circuit 1110 through a plurality of first connection wirings 1115 extending to the second structure 1100S in the first structure 1100F. The plurality of bit lines BL may be electrically connected to the page buffer 1120 through a plurality of second connection wirings 1125 extending to the second structure 1100S in the first structure 1100F.

In the first structure 1100F, the decoder circuit 1110 and the page buffer 1120 may perform a control operation on at least one of the plurality of memory cell transistors MC. The decoder circuit 1110 and the page buffer 1120 may be controlled by the logic circuit 1130.

The semiconductor device 1100 may communicate with the controller 1200 through the input/output pad 1101 electrically connected to the logic circuit 1130. The input/output pad 1101 may be electrically connected to the logic circuit 1130 through an input/output connection wiring 1135 extending to the second structure 1100S in the first structure 1100F.

The controller 1200 may include a processor 1210, a NAND controller 1220, and a host interface 1230. According to embodiments, the electronic system 1000 may include a plurality of semiconductor devices 1100, and in this case, the controller 1200 may control the plurality of semiconductor devices 1100.

The processor 1210 may control the overall operation of the electronic system 1000 including the controller 1200. The processor 1210 may operate according to certain firmware, and may control the NAND controller 1220 to access the semiconductor device 1100. The NAND controller 1220 may include a NAND interface 1221 communicating with the semiconductor device 1100.

A control command for controlling the semiconductor device 1100, data to be written to the plurality of memory cell transistors MC of the semiconductor device 1100, data to be read from the plurality of memory cell transistors MC of the semiconductor device 1100, etc. may be transmitted through the NAND interface 1221. The host interface 1230 may provide a communication function between the electronic system 1000 and an external host. When receiving a control command from an external host through the host interface 1230, the processor 1210 may control the semiconductor device 1100 in response to the control command.

Figure 19:
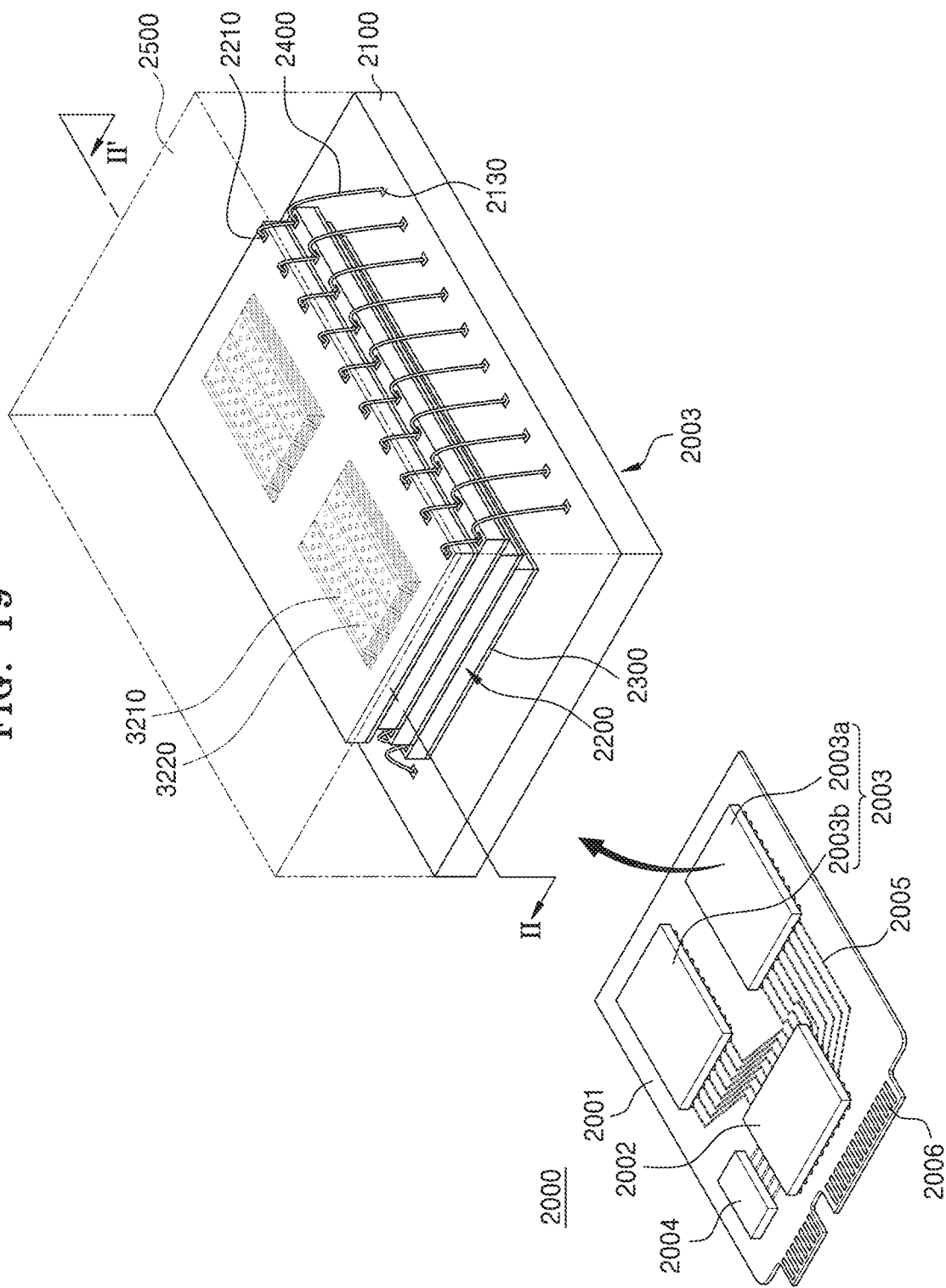
FIG. 19 is a diagram schematically illustrating an electronic system including a semiconductor device according to an embodiment of inventive concepts.

FIG. 19 is a perspective view schematically illustrating an electronic system 2000 including the semiconductor device 10 according to some example embodiments of inventive concepts.

Specifically, the electronic system 2000 according to some example embodiments of inventive concepts may include a main board 2001, a controller 2002 mounted on the main board 2001, one or more semiconductor packages 2003, and a DRAM 2004. The semiconductor package 2003 and the DRAM 2004 may be connected to the controller 2002 by a plurality of wiring patterns 2005 formed on the main board 2001.

The main board 2001 may include a connector 2006 including a plurality of pins coupled to an external host. The number and/or arrangement of the plurality of pins in the connector 2006 may vary according to a communication interface between the electronic system 2000 and the external host. In some example embodiments, the electronic system 2000 may communicate with the external host according to any one of interfaces such as Universal Serial Bus (USB), Peripheral Component Interconnect Express (PCI-Express), Serial Advanced Technology Attachment (SATA), an M-Phy for Universal Flash Storage (UFS), etc.

In some example embodiments, the electronic system 2000 may operate by power supplied from the external host through the connector 2006. The electronic system 2000 may further include a power management integrated circuit (PMIC) distributing power supplied from the external host to the controller 2002 and the semiconductor package 2003.

The controller 2002 may write data to or read data from the semiconductor package 2003, and may improve the operating speed of the electronic system 2000.

The DRAM 2004 may be a buffer memory for reducing a speed difference between the semiconductor package 2003 that is a data storage space and the external host. The DRAM 2004 included in the electronic system 2000 may operate as a kind of cache memory, and may provide a space temporarily storing data during a control operation on the semiconductor package 2003. When the DRAM 2004 is included in the electronic system 2000, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, a plurality of semiconductor chips 2200 on the package substrate 2100, an adhesive layer 2300 disposed on a lower surface of each of the plurality of semiconductor chips 2200, a connection structure 2400 electrically connecting the plurality of semiconductor chips 2200 and the package substrate 2100, and a molding layer 2500 covering the plurality of semiconductor chips 2200 and the connection structure 2400 on the package substrate 2100.

The package substrate 2100 may be a printed circuit board including a plurality of package upper pads 2130. Each of the plurality of semiconductor chips 2200 may include an input/output pad 2210. The input/output pad 2210 may correspond to the input/output pad 1101 of FIG. 19. Each of the plurality of semiconductor chips 2200 may include a plurality of gate stacks 3210 and a plurality of channel structures 3220. Each of the plurality of semiconductor chips 2200 may include the semiconductor device 10 described with reference to FIGS. 4 to 17B.

In some example embodiments, the connection structure 2400 may be a bonding wiring electrically connecting the input/output pad 2210 and the package upper pad 2130. Accordingly, in the first and second semiconductor packages 2003*a* and 2003*b*, the plurality of semiconductor chips 2200 may be electrically connected to each other using a bonding wire method, and may be electrically connected to the package upper pad 2130 of the package substrate 2100. In embodiments, in the first and second semiconductor packages 2003*a* and 2003*b*, the plurality of semiconductor chips 2200 may be electrically connected to each other by a connection structure including a through silicon via (TSV), instead of the connection structure 2400 of the bonding wire method.

In embodiments, the controller 2002 and the plurality of semiconductor chips 2200 may be included in one package. In embodiments, the controller 2002 and the plurality of semiconductor chips 2200 may be mounted on a separate interposer substrate different from the main substrate 2001, and the controller 2002 and the plurality of semiconductor chips 2200 may be connected to each other by wiring formed on the interposer substrate.

Figure 20:
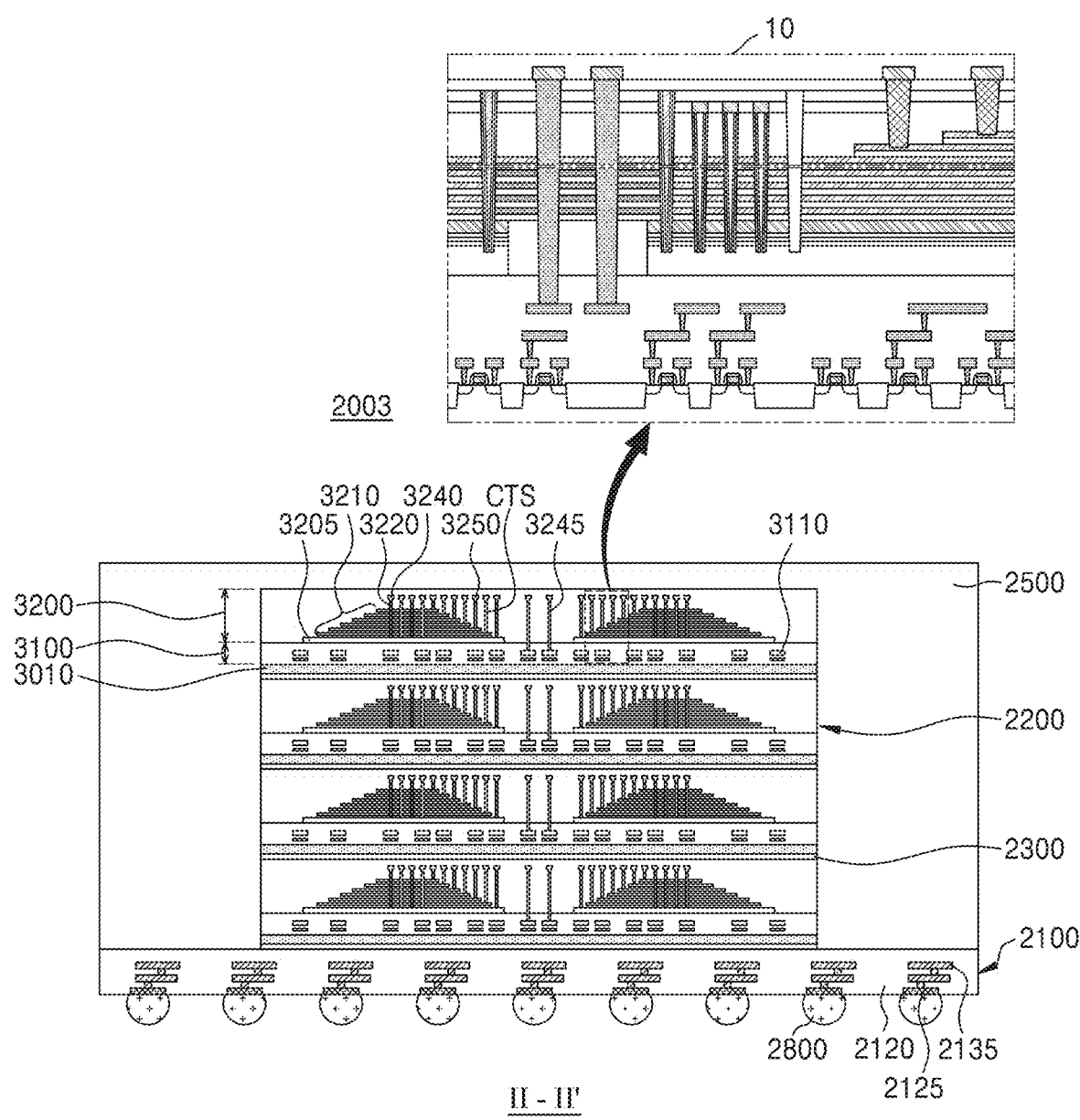
FIG. 20 is a cross-sectional view schematically illustrating a semiconductor package according to an embodiment of inventive concepts.

FIG. 20 is a cross-sectional view schematically illustrating a semiconductor package 2003 according to some example embodiments of inventive concepts.

For example, FIG. 20 shows a configuration along the line II-IT of FIG. 19 in more detail. In the semiconductor package 2003, the package substrate 2100 may be a printed circuit board. The package substrate 2100 may include a package substrate body 2120, the plurality of package upper pads (2130 in FIG. 19) arranged on an upper surface of the package substrate body 2120, a plurality of lower pads 2125 arranged on a lower surface of the package substrate body 2120 or exposed through the lower surface, and a plurality of internal wirings 2135 electrically connecting the plurality of upper pads 2130 and the plurality of lower pads 2125 inside the package substrate body 2120. The plurality of upper pads 2130 may be electrically connected to the plurality of connection structures 2400. The plurality of lower pads 2125 may be connected to the plurality of wiring patterns 2005 on the main board 2001 of the electronic system 2000 illustrated in FIG. 19 through a plurality of conductive connectors 2800.

Each of the plurality of semiconductor chips 2200 may include a semiconductor substrate 3010 and a first structure 3100 and a second structure 3200 sequentially stacked on the semiconductor substrate 3010. The first structure 3100 may include a peripheral circuit region including a plurality of peripheral wirings 3110. The second structure 3200 may include a common source line 3205, the gate stack 3210 on the common source line 3205, a channel structure 3220 penetrating the gate stack 3210, and a bit line 3240 electrically connected to the channel structure 3220. The second structure 3200 may include a contact pad 3250 and the contact structure CTS positioned in a connection region. In embodiments, each of the plurality of semiconductor chips 2200 may have the same configuration as that of the semiconductor device 10 of FIGS. 4 to 17B.

Each of the plurality of semiconductor chips 2200 may include a through wiring 3245 electrically connected to the plurality of peripheral wirings 3110 of the first structure 3100 and extending into the second structure 3200. The through wiring 3245 may be disposed outside the gate stack 3210. In some example embodiments, the semiconductor package 2003 may further include a through wiring penetrating the gate stack 3210. Each of the plurality of semiconductor chips 2200 may further include the input/output pad (2210 of FIG. 19) electrically connected to the plurality of peripheral wirings 3110 of the first structure 3100.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While inventive concepts have been particularly shown and described with reference to embodiments thereof, it will be understood that various changes in form and details may be made therein without departing from the spirit and scope of the following claims. Example embodiments are not necessarily mutually exclusive. For example, some example embodiments may include features described with reference to one or more figures and may also include other features described with reference to one or more other figures.

What is claimed is:

1. A semiconductor device comprising:
a memory cell region on a substrate and comprising a real memory cell region and a dummy memory cell region; and
a connection region extending with the memory cell region in a first direction that is parallel to a surface of the substrate,
wherein the dummy memory cell region comprises a plurality of dummy vertical channel structures spaced apart from each other,
each of the plurality of dummy vertical channel structures comprises a vertical channel pattern in contact with the substrate and penetrating a stack structure comprising a plurality of insulating layers and a plurality of gate electrodes repeatedly stacked in a third direction that is perpendicular to a surface of the substrate, and
a protection pattern surrounds, and is disposed on an outermost side surface of, the vertical channel pattern of at least one of the plurality of dummy vertical channel structures.

2. The semiconductor device of claim 1, wherein the dummy memory cell region is in contact with the real memory cell region.

3. The semiconductor device of claim 1, wherein the plurality of dummy vertical channel structures are arranged in a zigzag in the first direction and in a second direction that is horizontal to the surface of the substrate and is perpendicular to the first direction.

4. The semiconductor device of claim 1, wherein the vertical channel pattern comprises an epitaxial semiconductor pattern on the substrate.

5. The semiconductor device of claim 1, wherein the protection pattern is in contact with a lowermost gate electrode on the substrate.

6. The semiconductor device of claim 1, wherein the protection pattern is on an edge part of the dummy memory cell region apart from the real memory cell region.

7. The semiconductor of claim 1, wherein the protection pattern comprises a first protection pattern and a second protection pattern respectively on an upper edge part of the dummy memory cell region and on a lower edge part of the dummy memory cell region, the upper edge part and the lower edge part apart from the real memory cell region.

8. The semiconductor device of claim 7, wherein the first protection pattern and the second protection pattern are apart from each other in a second direction parallel to a surface of the substrate and perpendicular to the first direction in the dummy memory cell region.

9. The semiconductor device of claim 8, wherein the first protection pattern and the second protection pattern are aligned in the second direction.

10. The semiconductor device of claim 8, wherein the first protection pattern and the second protection pattern are shifted from each other in the first direction so as not to be aligned in the second direction.

11. The semiconductor device of claim 1, wherein the protection pattern surrounds two vertical channel patterns included in two vertical channel structures adjacent to each other.

12. The semiconductor device of claim 1, wherein the protection pattern surrounds two vertical channel patterns included in two dummy vertical channel structures adjacent to each other in the first direction and in a second direction that is horizontal to the surface of the substrate and is perpendicular to the first direction.

13. A semiconductor device comprising:
a memory cell region on a substrate and comprising a real memory cell region and a dummy memory cell region; and
a connection region extending with the memory cell region in a first direction parallel to a surface of the substrate, wherein the dummy memory cell region comprises first and second dummy vertical channel structures spaced apart from each other, the first and second dummy vertical channel structures respectively comprise first and second vertical channel patterns in contact with the substrate and penetrating a stack structure comprising a plurality of insulating layers and a plurality of gate electrodes repeatedly stacked in a third direction perpendicular to a surface of the substrate, a protection pattern surrounds the first vertical channel pattern, and a gate oxide layer surrounds the second vertical channel pattern, and the protection pattern has a shape different than that of the gate oxide layer.

14. The semiconductor device of claim 13, wherein the dummy memory cell region is between the real memory cell region and the connection region in the first direction.

15. The semiconductor device of claim 13, wherein the first vertical channel pattern and the second vertical channel pattern comprise epitaxial semiconductor patterns on the substrate.

16. The semiconductor device of claim 13, wherein a thickness of the protection pattern is greater than a thickness of the gate oxide layer.

17. The semiconductor device of claim 13, wherein the protection pattern is on an edge part of the dummy memory cell region apart from the real memory cell region.

18. A semiconductor device comprising:
a memory cell region on a substrate and comprising a real memory cell region and a dummy memory cell region; and
a connection region extending with the memory cell region in a first direction parallel to a surface of the substrate, wherein the dummy memory cell region comprises first and second dummy vertical channel structures spaced apart from each other, the first and second dummy vertical channel structures respectively comprise first and second vertical channel patterns in a first recess region and a second recess region recessed from a surface of the substrate to an upper surface of the substrate, the first and second vertical channel patterns penetrating a stack structure comprising a plurality of insulating layers and a plurality of gate electrodes repeatedly stacked in a third direction perpendicular to the surface of the substrate, a protection pattern surrounds the first vertical channel pattern without invading both outermost side surfaces of the first vertical channel pattern, and the semiconductor device includes a gate oxide layer that invades both side surfaces of the second vertical channel pattern.

19. The semiconductor device of claim 18, wherein the protection pattern and the gate oxide layer are in contact with a lowermost gate electrode on the substrate.

20. The semiconductor device of claim 18, wherein both side surfaces of the first vertical channel pattern in contact with the protection pattern are vertical surfaces in the third direction, and
both side surfaces of the second vertical channel pattern in contact with the gate oxide layer are curved surfaces in the third direction.

* * * * *